(12) United States Patent
Sasaki et al.

(10) Patent No.: US 6,849,473 B2
(45) Date of Patent: Feb. 1, 2005

(54) SEMICONDUCTOR LIGHT-EMITTING DEVICE AND METHOD FOR MANUFACTURING THEREOF

(75) Inventors: Kazuaki Sasaki, Osaka (JP); Junichi Nakamura, Kashiba (JP); Shouichi Ohyama, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/253,609

(22) Filed: Sep. 25, 2002

(65) Prior Publication Data

US 2003/0020080 A1 Jan. 30, 2003

Related U.S. Application Data

(62) Division of application No. 09/838,592, filed on Apr. 20, 2001, now Pat. No. 6,476,421.

(30) Foreign Application Priority Data

Apr. 21, 2000 (JP) ........................................ 2000-120848

(51) Int. Cl.⁷ .............................................. H01L 21/00
(52) U.S. Cl. .............................. 438/22; 438/24; 438/42; 438/43; 438/44; 438/45; 438/46; 438/47
(58) Field of Search .......................... 438/22, 24, 42–47

(56) References Cited

U.S. PATENT DOCUMENTS

| 5,777,349 A | | 7/1998 | Nakamura et al. | |
| 5,838,028 A | * | 11/1998 | Horie et al. | ................. 257/183 |
| 6,298,077 B1 | | 10/2001 | He | |
| 6,387,721 B1 | * | 5/2002 | Hashimoto et al. | ........... 438/46 |

FOREIGN PATENT DOCUMENTS

| DE | 40 17 632 A1 | 12/1990 |
| EP | 0 702 414 A2 | 3/1996 |
| JP | 63-81884 A | 4/1988 |
| JP | 2-205090 A | 8/1990 |
| JP | 2-260486 A | 10/1990 |
| JP | 3-3373 A | 1/1991 |
| JP | 3-283693 A | 12/1991 |
| JP | 4-212479 A | 8/1992 |
| JP | 4-229665 | 8/1992 |
| JP | 5-235408 A | 9/1993 |
| JP | 6-188509 A | 7/1994 |
| JP | 7-263810 A | 10/1995 |
| JP | 9-74221 | 3/1997 |
| JP | 9-260724 | 10/1997 |
| JP | 10-135560 A | 5/1998 |
| JP | 10-214996 | 8/1998 |

OTHER PUBLICATIONS

Japanese Office Action mailed May 11, 2004 in corresponding JP Patent Application No. 2000–120848.
Weisbuch et al, "Quantum Semiconductor Structures, Fundamentals and Applications", Academic Press, Inc., Harcourt Brace Jovanovich Publishers, 1991, pp. 3–4.

* cited by examiner

Primary Examiner—Long Pham
Assistant Examiner—Wai-Sing Louie
(74) Attorney, Agent, or Firm—Nixon & Vanderhye, P.C.

(57) ABSTRACT

In a semiconductor light-emitting device, on an n-GaAs substrate are stacked an n-GaAs buffer layer, an n-cladding layer, an undoped active layer, a p-cladding layer, a p-intermediate band gap layer and a p-current diffusion layer. Further, a first electrode is formed under the n-GaAs substrate, and a second electrode is formed on the grown-layer side. In this process, a region of the p-intermediate band gap layer just under the second electrode is removed, the p-current diffusion layer is stacked in the removal region on the p-cladding layer, and a junction plane of the p-current diffusion layer and the p-cladding layer becomes high in resistance due to an energy band structure of type II. This semiconductor light-emitting device is capable of reducing ineffective currents with a simple construction and taking out light effectively to outside, thus enhancing the emission intensity.

6 Claims, 24 Drawing Sheets

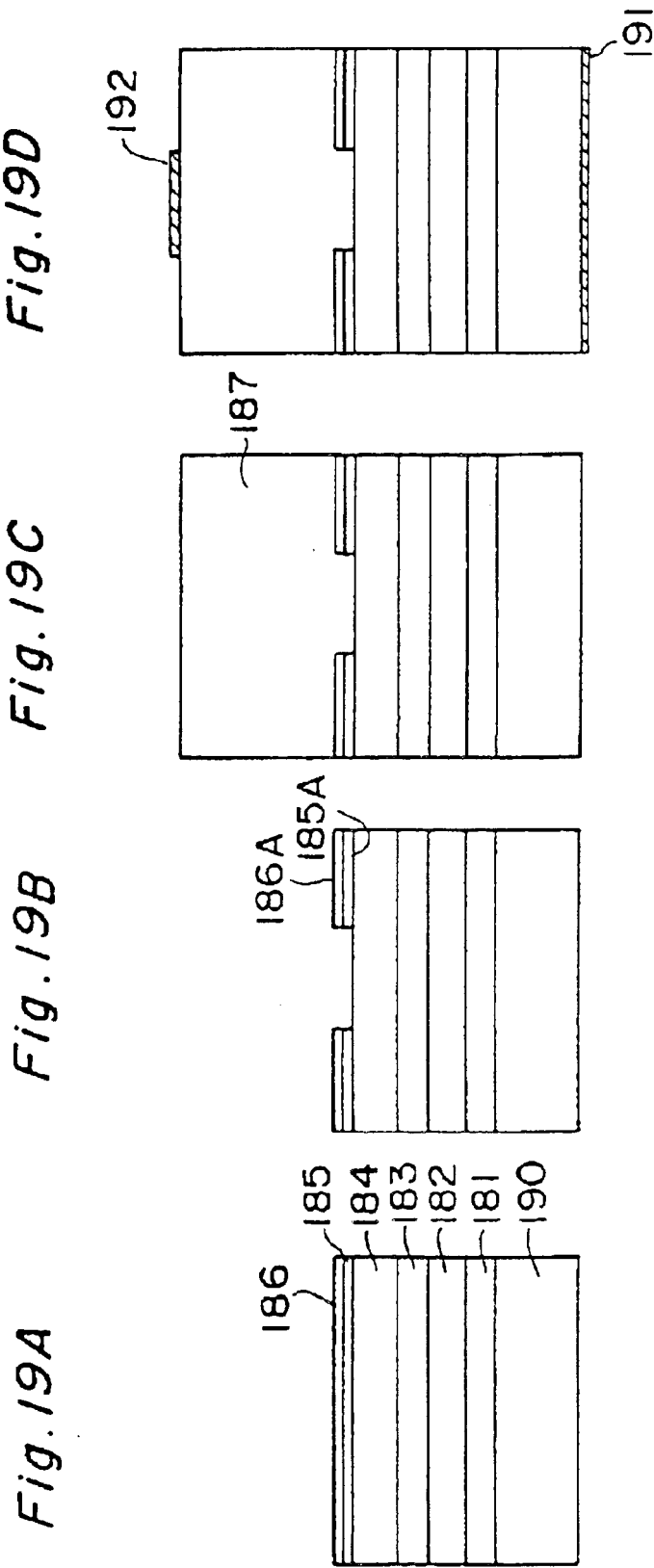

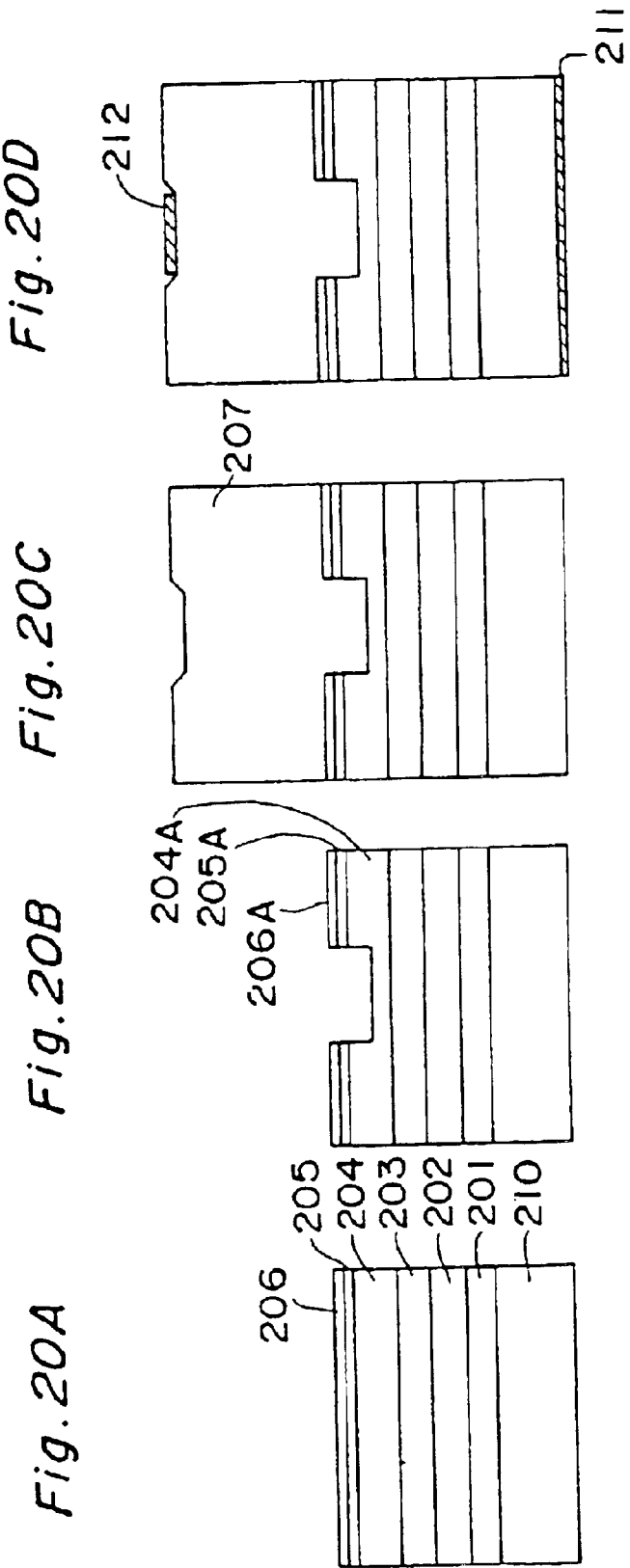

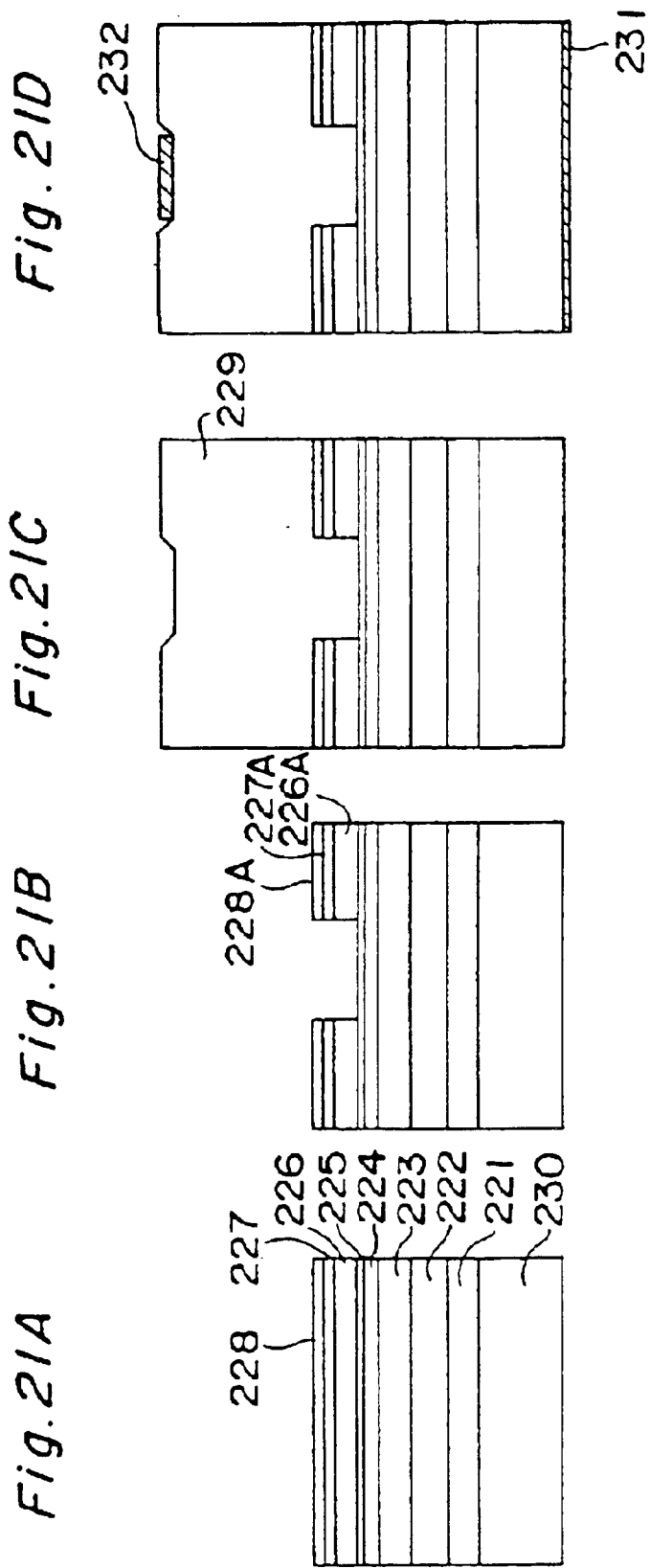

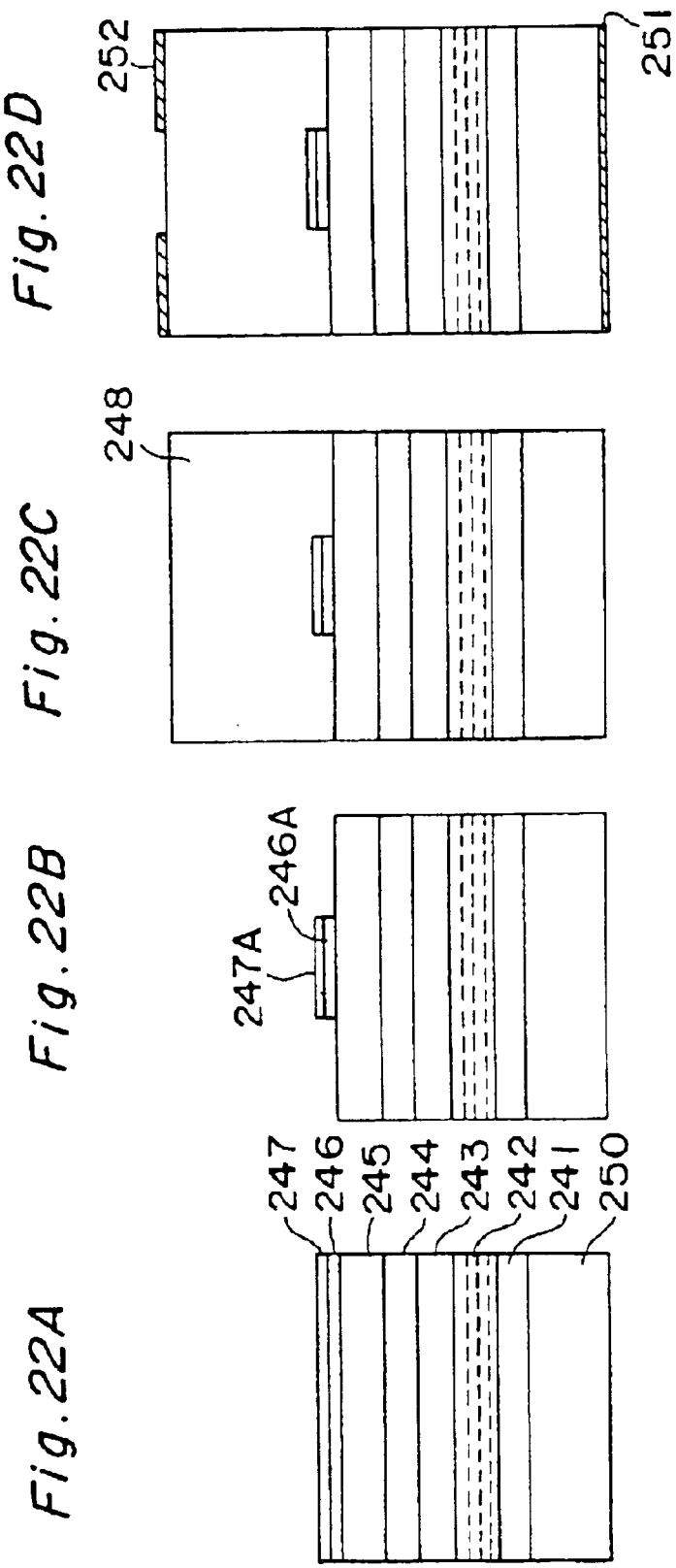

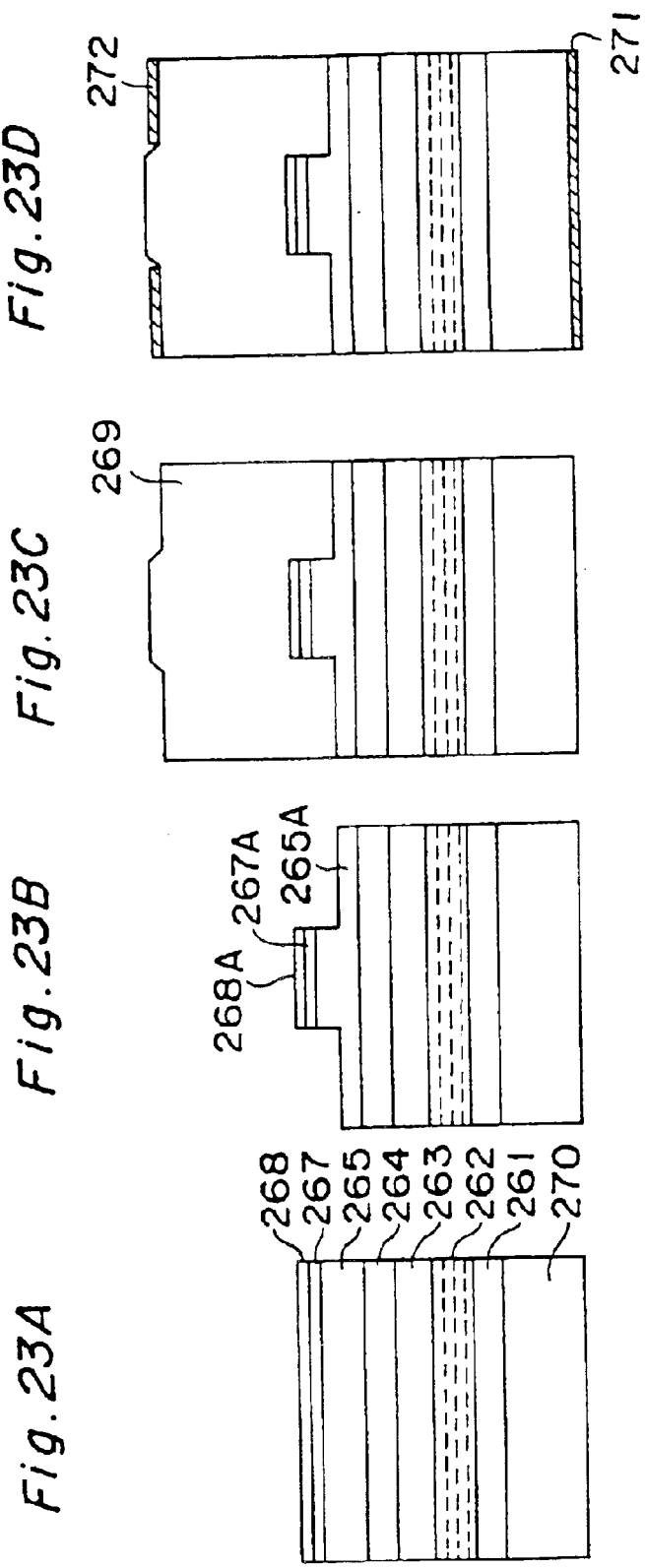

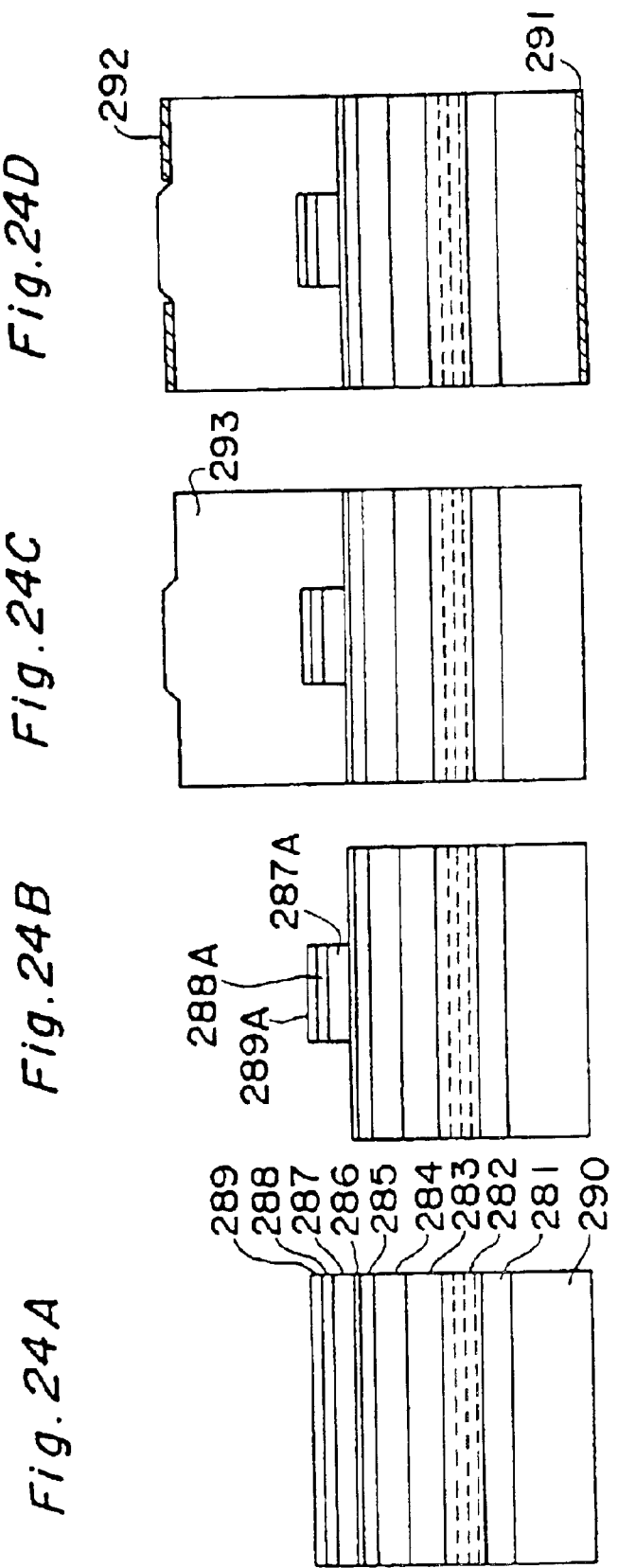

SEMICONDUCTOR LIGHT-EMITTING DEVICE AND METHOD FOR MANUFACTURING THEREOF

This application is a continuation-in-part of application Ser. No. 09/838,592, filed Apr. 20, 2001 now U.S. Pat. No. 6,476,421, the entire content of which is hereby incorporated by reference in this application.

BACKGROUND OF THE INVENTION

The present invention relates to a semiconductor light-emitting device having a current diffusion layer and method for manufacture thereof.

In recent years, LEDs (Light-Emitting Diodes), which are semiconductor light-emitting devices, have been in the limelight as indoor/outdoor display devices. In particular, with their trend toward higher brightness, the outdoor display market has been rapidly expanding while LEDs have been growing as a medium to replace neon signs. High-brightness LEDs of visible range in such fields have been developed by AlGaInP-based DH (Double Hetero) type LEDs. FIGS. 25A, 25B, 25C show a top view, a sectional view and a functional view, respectively, of a yellow-band AlGaInP-based LED as a semiconductor light-emitting device.

In this semiconductor light-emitting device, as shown in FIGS. 25A and 25B, an n-GaAs buffer layer 301 (thickness: 0.5 μm, Si doping: $5\times10^{17}$ cm$^{-3}$), an n-AlGaInP cladding layer 302 (thickness: 1.0 μm, Si doping: $5\times10^{17}$ cm$^{-3}$) an undoped $(Al_{0.3}Ga_{0.7})_{0.5}In_{0.5}P$ active layer 303 (thickness: 0.6 μm), a p-AlGaInP cladding layer 304 (thickness: 0.7 μm, Zn doping: $5\times10^{17}$ cm$^{-3}$), a p-AlGaAs current diffusion layer 305 (thickness: 6 μm, Zn doping: $3\times10^{18}$ cm$^{-3}$), and a p-GaAs cap layer 306 (thickness: 0.1 μm, Zn doping: $3\times10^{18}$ cm$^{-3}$) are grown on an n-GaAs substrate 310 by MOCVD process, and a first electrode 311 is formed on the substrate side while a second electrode 312 is formed on the grown layer side. Regions of the p-GaAs cap layer 306 other than a device center region thereof opposed to the grown-layer side second electrode 312 have been removed. In this semiconductor light-emitting device, having a pn junction formed within the active layer 303, light emission is generated by recombination of electrons and holes. With this semiconductor light-emitting device molded into 5 mm dia. resin, when a 20 mA current was passed therethrough, the resultant emission intensity was 1.5 cd.

In this semiconductor light-emitting device, as shown in FIG. 25C, a current injected from the grown-layer side second electrode 312 expands within the p-AlGaAs current diffusion layer 305, being injected into the active layer 303, where most part of the current flows to the region under the second electrode 312. As a result, light emission over the region under the second electrode 312 is intercepted by the second electrode 312 so as not to go outside, resulting in an ineffective current. This leads to a problem that the emission intensity would be lower.

Thus, as an solution to this problem, there has been proposed a structure in which a current blocking layer for blocking the current is introduced under the second electrode 312.

FIGS. 26A–26C show a top view, a sectional view and a functional view, respectively, of a semiconductor light-emitting device having the structure in which the current blocking layer is introduced. In this semiconductor light-emitting device, as shown in FIGS. 26A and 26B, an n-GaAs buffer layer 321 (thickness: 0.5 μm, Si doping: $5\times10^{17}$ cm$^{-3}$), an n-AlGaInP cladding layer 322 (thickness: 1.0 μm, Si doping: $5\times10^{17}$ cm$^{-3}$), an undoped $(Al_{0.3}Ga_{0.7})_{0.5}In_{0.5}P$ active layer 323 (thickness: 0.6 μm), a p-AlGaInP cladding layer 324 (thickness: 0.7 μm, Zn doping: $5\times10^{17}$ cm$^{-3}$), a p-AlGaInP intermediate band gap layer 325 (thickness: 0.15 μm, Zn doping: $2\times10^{18}$ cm$^{-3}$), a p-GaP first current diffusion layer 326 (thickness: 1.5 μm, Zn doping: $1\times10^{18}$ cm$^{-3}$), an n-GaP current blocking layer 327 (thickness: 0.4 μm, Si doping: $3\times10^{18}$ cm$^{-3}$), and a p-GaP second current blocking layer 328 (thickness: 6 μm, Zn doping: $2\times10^{18}$ cm$^{-3}$) are grown on an n-GaAs substrate 330 by MOCVD process, and a first electrode 331 is formed on the substrate side while a second electrode 332 is formed on the grown layer side.

In this semiconductor light-emitting device, the n-GaP current blocking layer 327 is subjected to etching removal with its device center region left, and the second current diffusion layer 328 is re-grown thereon.

In this semiconductor light-emitting device, as shown in FIG. 26C, a current injected from the grown-layer side second electrode 332, avoiding the n-GaP current blocking layer 327 provided under the second electrode 332, flows to both sides of the n-GaP current blocking layer 327. As a result, as compared with the semiconductor light-emitting device shown in FIG. 25, this semiconductor light-emitting device involves less ineffective current that flows to under the second electrode 332, resulting in increased emission intensity. With this semiconductor light-emitting device applied to a 5 mm dia. molded article, the emission intensity at a 20 mA current conduction was 2.0 cd, an increase of slightly more than 30% as compared with the semiconductor light-emitting device shown in FIG. 25. However, because the thickness of the p-GaP first current diffusion layer 326 provided under the n-GaP current blocking layer 327 is as thick as 1.5 μm, there is still a sneak current going to under the n-GaP current blocking layer 327 as shown in FIG. 26C. Thus, there is a problem that the ineffective current is not eliminated completely.

SUMMARY OF THE INVENTION

Accordingly, an object of the present invention is to provide a semiconductor light-emitting device, as well as a method for manufacture thereof, which can be reduced in ineffective current with a simple construction and can effectively take out light to outside.

In order to achieve the above object, there is provided a semiconductor light-emitting device comprising: a first-conductive-type first cladding layer, a first-conductive-type or second-conductive-type or an undoped active layer, a second-conductive-type second cladding layer, a second-conductive-type intermediate band gap layer and a second-conductive-type current diffusion layer, all of which are stacked on one side of a surface of a first-conductive-type semiconductor substrate, a first electrode formed on the other side of the surface of the first-conductive-type semiconductor substrate, and a second electrode formed partly on the second-conductive-type current diffusion layer, wherein a region of the second-conductive-type intermediate band gap layer just under the second electrode is removed, and the second-conductive-type current diffusion layer is stacked in the removal region on the second-conductive-type second cladding layer, and wherein a junction plane of the second-conductive-type current diffusion layer and the second-conductive-type second cladding layer has an energy band structure of type II.

With this semiconductor light-emitting device having the above constitution, in the removal region of the secondconductive-type intermediate band gap layer, since the junction plane of the second-conductive-type current diffusion layer and the second-conductive-type second cladding layer becomes high in resistance due to the energy band structure of type II, the current flows to around the removal region, allowing ineffective currents flowing under the second electrode formed partly on the second-conductive-type current diffusion layer to be reduced so that the emission intensity is enhanced. It is noted that the first electrode formed on the other side of the surface of the first-conductive-type semiconductor substrate may be either a partial electrode or a full electrode.

Also, there is provided a semiconductor light-emitting device comprising: a first-conductive-type first cladding layer, a first-conductive-type or second-conductive-type or an undoped active layer, a second-conductive-type second cladding layer, a second-conductive-type intermediate band gap layer and a second-conductive-type current diffusion layer, all of which are stacked on one side of a surface of a first-conductive-type semiconductor substrate, wherein a device center region of the second-conductive-type intermediate band gap layer is removed, and the second-conductive-type current diffusion layer is stacked in the removal region on the second-conductive-type second cladding layer, the second-conductive-type current diffusion layer and the second-conductive-type second cladding layer have an energy band structure in which an upper-end position of valence band and a lower-end position of conduction band are in a type II relation, and wherein the semiconductor light-emitting device further comprises a first electrode formed overall on the other side of the surface of the first-conductive-type semiconductor substrate, and a second electrode formed over the device center region on the second-conductive-type current diffusion layer.

With this semiconductor light-emitting device having the above constitution, in the removal region of the second-conductive-type intermediate band gap layer at the device center region, since the junction plane of the second-conductive-type current diffusion layer and the second-conductive-type second cladding layer becomes high in resistance due to the energy band structure of type II, the current flows to around the removal region, allowing ineffective currents flowing under the second electrode formed at the device center region on the second-conductive-type current diffusion layer to be reduced so that the emission intensity is enhanced.

In one embodiment of the present invention, an upper-side portion of a region of the second-conductive-type second cladding layer corresponding to the removal region of the second-conductive-type intermediate band gap layer is removed.

With the semiconductor light-emitting device of this embodiment, both the removal region at the device center region of the second-conductive-type intermediate band gap layer and the region where the upper-side portion of the second-conductive-type second cladding layer opposed to the removal region has been removed become high in resistance, and besides the high-resistance interface of the second-conductive-type current diffusion layer and the second-conductive-type second cladding layer is near the active layer. Thus, the ineffective currents flowing under the second electrode can further be reduced so that the emission intensity is further enhanced.

Also, there is provided a semiconductor light-emitting device comprising: a first-conductive-type first cladding layer, a first-conductive-type or second-conductive-type or an undoped active layer, a second-conductive-type second cladding layer, a second-conductive-type etching stop layer, a second-conductive-type third cladding layer, a second-conductive-type intermediate band gap layer and a second-conductive-type current diffusion layer, all of which are stacked on one side of a surface of a first-conductive-type semiconductor substrate, wherein device center regions of the second-conductive-type intermediate band gap layer and the second-conductive-type third cladding layer are removed, respectively, and the second-conductive-type current diffusion layer is stacked in the removal regions on the second-conductive-type etching stop layer, the second-conductive-type current diffusion layer, the second-conductive-type etching stop layer and the second-conductive-type second cladding layer have an energy band structure in which an upper-end position of valence band and a lower-end position of conduction band are in a type II relation, and wherein the semiconductor light-emitting device further comprises a first electrode formed overall on the other side of the surface of the first-conductive-type semiconductor substrate, and a second electrode formed over the device center region on the second-conductive-type current diffusion layer.

With the semiconductor light-emitting device having this constitution, the removal regions of the device center region where the second-conductive-type intermediate band gap layer and the second-conductive-type third cladding layer have been removed become high in resistance due to the fact that an energy band structure in which the upper-end position of the valence band and the lower-end position of the conduction band are in the type II relation is formed in the second-conductive-type current diffusion layer, the etching stop layer and the second cladding layer. Besides, the high-resistance interface can be formed near the active layer with high controllability by the presence of the second-conductive-type etching stop layer. Thus, there can be fabricated a semiconductor light-emitting device less in ineffective currents and high in emission intensity with a good yield.

In one embodiment of the present invention, the removal region at the device center region of the second-conductive-type intermediate band gap layer and the second electrode have generally identical configurations and are opposed to each other.

With the semiconductor light-emitting device of this embodiment, the emission efficiency can be optimized by the arrangement that the grown-layer side second electrode and the high-resistance region under the second electrode, both having generally equivalent configurations, are opposed to each other. Thus, the ineffective currents can be lessened and the emission intensity can be enhanced.

Also, there is provided a semiconductor light-emitting device comprising: a first-conductive-type first cladding layer, a first-conductive-type or second-conductive-type or an undoped active layer, a second-conductive-type second cladding layer, a second-conductive-type intermediate band gap layer and a second-conductive-type current diffusion layer, all of which are stacked on one side of a surface of a first-conductive-type semiconductor substrate, wherein a region of the second-conductive-type intermediate band gap layer other than its device center region is removed, and the second-conductive-type current diffusion layer is stacked in the removal region on the second-conductive-type second cladding layer, the second-conductive-type current diffusion layer and the second-conductive-type second cladding layer have an energy band structure in which an upper-end position of valence band and a lower-end position of conduction band are in a type II relation, and wherein the semiconductor light-emitting device further comprises a first electrode formed overall on the other side of the surface of the first-conductive-type semiconductor substrate, and a second electrode formed over the region other than the device center region on the second-conductive-type current diffusion layer.

With the semiconductor light-emitting device having this constitution, at the removal region where the region of the second-conductive-type intermediate band gap layer other than its device center region has been removed, the junction plane of the second-conductive-type current diffusion layer and the second-conductive-type second cladding layer having the energy band structure of the type II becomes high in resistance. Thus, the current flows to the device center region and, as a result, ineffective currents flowing under the second electrode formed over the region other than the device center region on the second-conductive-type current diffusion layer can be reduced, so that the emission intensity is enhanced.

In one embodiment of the present invention, an upper-side portion of the region of the second-conductive-type second cladding layer opposed to the removal region of the second-conductive-type intermediate band gap layer is removed.

With the semiconductor light-emitting device of this embodiment, both the removal region of the second-conductive-type intermediate band gap layer other than its device center region and the region where the upper-side portion of the second-conductive-type second cladding layer opposed to the removal region has been removed become high in resistance, and besides the high-resistance interface of the second-conductive-type current diffusion layer and the second-conductive-type second cladding layer is near the active layer. Thus, the ineffective currents flowing under the second electrode can further be reduced so that the emission intensity is further enhanced.

Also, there is provided a semiconductor light-emitting device comprising: a first-conductive-type first cladding layer, a first-conductive-type or second-conductive-type or an undoped active layer, a second-conductive-type second cladding layer, a second-conductive-type etching stop layer, a second-conductive-type third cladding layer, a second-conductive-type intermediate band gap layer and a second-conductive-type current diffusion layer, all of which are stacked on one side of a surface of a first-conductive-type semiconductor substrate, wherein regions of the second-conductive-type intermediate band gap layer and the second-conductive-type third cladding layer other than their device center regions are removed, respectively, and the second-conductive-type current diffusion layer is stacked in the removal regions on the second-conductive-type etching stop layer, the second-conductive-type current diffusion layer, the second-conductive-type etching stop layer and the second-conductive-type second cladding layer have an energy band structure in which an upper-end position of valence band and a lower-end position of conduction band are in a type II relation, and wherein the semiconductor light-emitting device further comprises a first electrode formed overall on the one side of the surface of the first-conductive-type semiconductor substrate, and a second electrode formed over the region other than the device center region on the second-conductive-type current diffusion layer.

With the semiconductor light-emitting device of this constitution, the removal regions other than the device center regions where the regions of the second-conductive-type intermediate band gap layer and the second-conductive-type third cladding layer have been removed become high in resistance due to the fact that an energy band structure in which the upper-end position of the valence band and the lower-end position of the conduction band are in the type II relation is formed in the second-conductive-type current diffusion layer, etching stop layer and second cladding layer, and besides the high-resistance interface can be formed with high controllability near the active layer by the presence of the second-conductive-type etching stop layer. Thus, there can be fabricated a semiconductor light-emitting device less in ineffective currents and high in emission intensity with a good yield.

In one embodiment of the present invention, a protective layer of the second conductive type is formed on the second-conductive-type intermediate band gap layer.

With the semiconductor light-emitting device of this embodiment, since the second-conductive-type protective layer is present on the second-conductive-type intermediate band gap layer, there is no resistance layer of the interface with the current diffusion layer formed on the second-conductive-type protective layer. Thus, the operating voltage can be lowered.

In one embodiment of the present invention, the first-conductive-type semiconductor substrate is made of GaAs, the first-conductive-type first cladding layer, the first-conductive-type or second-conductive-type or undoped active layer and the second-conductive-type second cladding layer are made of an AlGaInP-based compound semiconductor that provides lattice matching with GaAs, the second-conductive-type current diffusion layer is made of a GaP- or AlGaInP-based compound semiconductor, and the second-conductive-type intermediate band gap layer is made of an AlGaInP-based compound semiconductor.

With the semiconductor light-emitting device of this embodiment, ineffective currents can be reduced so that an AlGaInP-based semiconductor light-emitting device of high emission intensity can be realized.

In one embodiment of the present invention, the first-conductive-type semiconductor substrate is made of GaAs, the first-conductive-type first cladding layer, the first-conductive-type or second-conductive-type or undoped active layer, the second-conductive-type second cladding layer, the second-conductive-type etching stop layer and the second-conductive-type third cladding layer are made of an AlGaInP-based compound semiconductor that provides lattice matching with GaAs, the second-conductive-type current diffusion layer is made of a GaP- or AlGaInP-based compound semiconductor, and the second-conductive-type intermediate band gap layer is made of an AlGaInP-based compound semiconductor.

With the semiconductor light-emitting device of this embodiment, ineffective currents can be reduced with a simple construction so that an AlGaInP-based semiconductor light-emitting device of high emission intensity can be realized.

In one embodiment of the present invention, the second-conductive-type intermediate band gap layer made of the AlGaInP-based compound semiconductor has a rate Δa/a of lattice matching to GaAs falling within a range of −3.2%≦Δa/a≦−2.5%.

With the semiconductor light-emitting device of this embodiment, by the arrangement that the lattice matching rate Δa/a of the second-conductive-type intermediate band gap layer to GaAs is set to within a range of −3.2%≦Δa/a≦−2.5% in an AlGaInP-based semiconductor light-emitting device, ineffective currents can be reduced and the emission intensity can be enhanced, and besides, the operating voltage can be lowered. Also, lattice defects on the device surface can be lessened and the reliability can be improved.

In one embodiment of the present invention, the second-conductive-type intermediate band gap layer is composed of a plurality of AlGaInP layers having different rates of lattice matching to GaAs, the lattice matching rates Δa/a of those AlGaInP layers each falling within a range of −3.2≦Δa/a≦−2.5%.

With the semiconductor light-emitting device of this embodiment, the AlGaInP layers composing the second-conductive-type intermediate band gap layer are different from one another in the lattice matching rate and moreover the lattice matching rates Δa/a of those AlGaInP layers each fall within a range of −3.2≦Δa/a≦−2.5%. As a result, in the AlGaInP-based light-emitting device, ineffective currents can be reduced, by which the emission intensity can be enhanced, and besides the operating voltage can further be lowered and lattice defects on the device surface can be lessened.

In one embodiment of the present invention, a second-conductive-type protective layer made of GaP or an AlGaInP-based compound semiconductor having a Al composition ratio of not more than 20% relative to the total of III group is stacked on the second-conductive-type intermediate band gap layer.

With the semiconductor light-emitting device of this embodiment, since GaP or an AlGaInP protective layer containing less Al is present on the second-conductive-type intermediate band gap layer, there is no resistance layer with the second-conductive-type current diffusion layer formed on the AlGaInP protective layer, so that the operating voltage can be lowered.

In one embodiment of the present invention, the second-conductive-type second cladding layer and the second-conductive-type third cladding layer both made of an AlGaInP-based compound semiconductor have a composition of $(Al_xGa_{1-x})_{0.5}In_{0.5}P$ (where $0.6 \leq X \leq 1.0$).

With the semiconductor light-emitting device of this embodiment, the second-conductive-type second cladding layer and the second-conductive-type third cladding layer each have a composition of $(Al_xGa_{1-x})_{0.5}In_{0.5}P$ (where $0.6 \leq X \leq 1.0$). As a result of this, the operating voltage can be lowered.

In one embodiment of the present invention, the second-conductive-type intermediate band gap layer has a layer thickness of not more than 0.5 μm.

With the semiconductor light-emitting device of this embodiment, the second-conductive-type intermediate band gap layer has a layer thickness of not more than 0.5 μm. As a result of this, the operating voltage can be lowered.

In one embodiment of the present invention, the second-conductive-type intermediate band gap layer has a carrier concentration of not less than $0.5 \times 10^{18}$ cm$^{-3}$.

With the semiconductor light-emitting device of this embodiment, the second-conductive-type intermediate band gap layer has a carrier concentration of not less than $0.5 \times 10^{18}$ cm$^{-3}$. As a result of this, the operating voltage can be lowered.

Also, there is provided a method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing a device center region of the second-conductive-type protective layer and a device center region of the second-conductive-type intermediate band gap layer, respectively, by etching;

after the removal step of the second-conductive-type protective layer and intermediate band gap layer, stacking a current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the device center region on the second-conductive-type current diffusion layer.

With this semiconductor light-emitting device manufacturing method, the removal region where the device center region of the second-conductive-type intermediate band gap layer has been removed becomes high in resistance because an energy band structure in which the upper-end position of the valence band and the lower-end position of the conduction band are in the type II relation is formed in the second-conductive-type current diffusion layer and second cladding layer become high in resistance. Thus, the current flows to around the removal region, so that ineffective currents flowing under the second electrode formed in the device center region on the second-conductive-type current diffusion layer can be reduced, allowing the emission intensity to be enhanced. Therefore, a semiconductor light-emitting device of high emission intensity can be manufactured.

Also, there is provided a method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing a device center region of the second-conductive-type protective layer and a device center region of the second-conductive-type intermediate band gap layer, respectively, by etching, and further removing an upper-side portion of a region of the second-conductive-type second cladding layer corresponding to the removal region by etching;

after the removal step of the second-conductive-type protective layer, intermediate band gap layer and second cladding layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the device center region on the second-conductive-type current diffusion layer.

With this semiconductor light-emitting device manufacturing method, the removal region where the device center region of the second-conductive-type intermediate band gap layer has been removed becomes high in resistance because an energy band structure in which the upper-end position of the valence band and the lower-end position of the conduction band are in the type II relation is formed in the second-conductive-type current diffusion layer and second cladding layer become high in resistance. Thus, the current flows to around the removal region, so that ineffective currents flowing under the second electrode formed in the device center region on the second-conductive-type current diffusion layer can be reduced, allowing the emission intensity to be enhanced. Therefore, a semiconductor light-emitting device of high emission intensity can be manufactured.

Also, there is provided a method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type etching stop layer, a second-conductive-type third cladding layer, a second-conductive-type intermediate band gap layer and a second-conductive-type protective layer;

removing device center regions of the second-conductive-type protective layer, the second-conductive-type intermediate band gap layer and the second-conductive-type third cladding layer by etching;

after the removal step of the second-conductive-type protective layer, intermediate band gap layer and third cladding layer, stacking a second-conductive-type current diffusion layer on the second-conductive-type protective layer and the second-conductive-type etching stop layer to form, in the second-conductive-type current diffusion layer, the second-conductive-type etching stop layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the device center region on the second-conductive-type current diffusion layer.

With this semiconductor light-emitting device manufacturing method, the removal region where the device center region of the second-conductive-type intermediate band gap layer has been removed becomes high in resistance because an energy band structure in which the upper-end position of the valence band and the lower-end position of the conduction band are in the type II relation is formed in the second-conductive-type current diffusion layer, the second-conductive-type etching stop layer and second cladding layer become high in resistance. Thus, the current flows to around the removal region, so that ineffective currents flowing under the second electrode formed in the device center region on the second-conductive-type current diffusion layer can be reduced, allowing the emission intensity to be enhanced. Therefore, a semiconductor light-emitting device of high emission intensity can be manufactured. Besides, the high-resistance interface can be formed with high controllability near the active layer by the presence of the second-conductive-type etching stop layer. Thus, the yield of this semiconductor light-emitting device can be improved.

Also, there is provided a method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing regions of the second-conductive-type protective layer and the second-conductive-type intermediate band gap layer other than their device center regions, respectively, by etching;

after the removal step of the second-conductive-type protective layer and intermediate band gap layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

With this semiconductor light-emitting device manufacturing method, the removal region where the region of the second-conductive-type intermediate band gap layer other than its device center region has been removed becomes high in resistance due to the fact that an energy band structure in which the upper-end position of the valence band and the lower-end position of the conduction band are in the type II relation is formed in the second-conductive-type current diffusion layer and second cladding layer. Thus, the current flows to around the device center region and, as a result, ineffective currents flowing under the second electrode formed over the region other than the device center region on the second-conductive-type current diffusion layer can be reduced, so that the emission intensity is enhanced. Therefore, a semiconductor light-emitting device of high emission intensity can be manufactured.

Also, there is provided a method for manufacturing a semiconductor light-emitting device, comprising the steps of:

stacking, one by one on one side of a surface of a first-conductive-type semiconductor substrate, a firstconductive-type first cladding layer, a first-conductive-type or second-conductive-type or an undoped active layer, a second-conductive-type second cladding layer, a second-conductive-type intermediate band gap layer and a second-conductive-type protective layer;

removing regions of the second-conductive-type protective layer and the second-conductive-type intermediate band gap layer other than their device center regions, respectively, by etching, and further removing an upper-side portion of a region of the second-conductive-type second cladding layer corresponding to the removal region by etching;

after the removal step of the second-conductive-type protective layer, intermediate band gap layer and second cladding layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

With this semiconductor light-emitting device manufacturing method, the removal region where the region of the second-conductive-type intermediate band gap layer other than its device center region has been removed becomes high in resistance due to the fact that an energy band structure in which the upper-end position of the valence band and the lower-end position of the conduction band are in the type II relation is formed in the second-conductive-type current diffusion layer and second cladding layer. Thus, the current flows to around the device center region and, as a result, ineffective currents flowing under the second electrode formed over the region other than the device center region on the second-conductive-type current diffusion layer can be reduced, so that the emission intensity is enhanced. Therefore, a semiconductor light-emitting device of high emission intensity can be manufactured.

Also, there is provided a method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type etching stop layer, a second-conductive-type third cladding layer, a second-conductive-type intermediate band gap layer and a second-conductive-type protective layer;

removing regions of the second-conductive-type protective layer, the second-conductive-type intermediate band gap layer and the second-conductive-type third cladding layer other than their device center regions, respectively, by etching;

after the removal step of the second-conductive-type protective layer, intermediate band gap layer and third cladding layer, stacking a second-conductive-type current diffusion layer on the second-conductive-type protective layer and the second-conductive-type etching stop layer to form, in the second-conductive-type current diffusion layer, the second-conductive-type etching stop layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

With this semiconductor light-emitting device manufacturing method, the removal region where the region of the second-conductive-type intermediate band gap layer other than its device center region has been removed becomes high in resistance due to the fact that an energy band structure in which the upper-end position of the valence band and the lower-end position of the conduction band are in the type II relation is formed in the second-conductive-type current diffusion layer, the second-conductive-type etching stop layer and second cladding layer. Thus, the current flows to around the device center region and, as a result, ineffective currents flowing under the second electrode formed over the region other than the device center region on the second-conductive-type current diffusion layer can be reduced, so that the emission intensity is enhanced. Therefore, a semiconductor light-emitting device of high emission intensity can be manufactured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

7B is a sectional view of the semiconductor light-emitting device.

FIGS. 19A–19D are views showing a semiconductor light-emitting device manufacturing method which is a twelfth embodiment of the invention;

FIGS. 20A–20D are views showing a semiconductor light-emitting device manufacturing method which is a thirteenth embodiment of the invention;

FIGS. 21A–21D are views showing a semiconductor light-emitting device manufacturing method which is a fourteenth embodiment of the invention;

FIGS. 22A–22D are views showing a semiconductor light-emitting device manufacturing method which is a fifteenth embodiment of the invention;

FIGS. 23A–23D are views showing a semiconductor light-emitting device manufacturing method which is a sixteenth embodiment of the invention;

FIGS. 24A–24D are views showing a semiconductor light-emitting device manufacturing method which is a seventeenth embodiment of the invention;

DETAILED DESCRIPTION OF THE PREFERRED EMBODIMENTS

Hereinbelow, the semiconductor light-emitting device and method of manufacture thereof according to the present invention are described in detail by way of embodiments thereof illustrated in the accompanying drawings.

(First Embodiment)

Figure 1A:
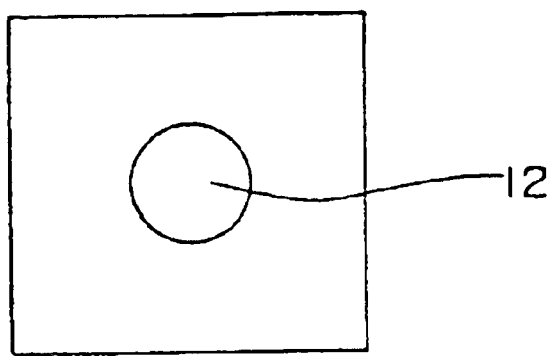
FIG. 1A is a top view of a semiconductor light-emitting device which is a first embodiment of the invention.
Figure 1B:
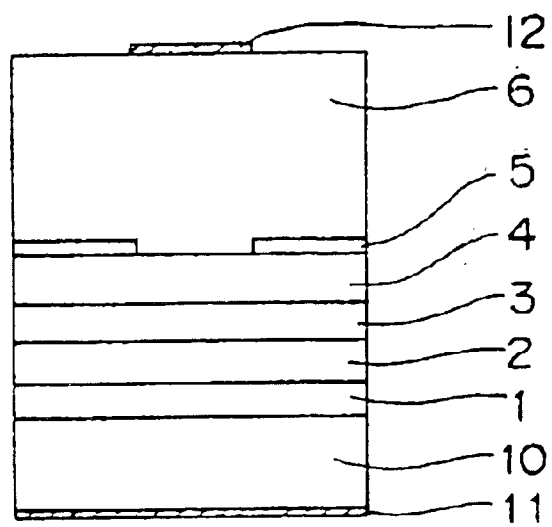
FIG. 1B is a sectional view of the semiconductor light-emitting device.
Figure 1C:
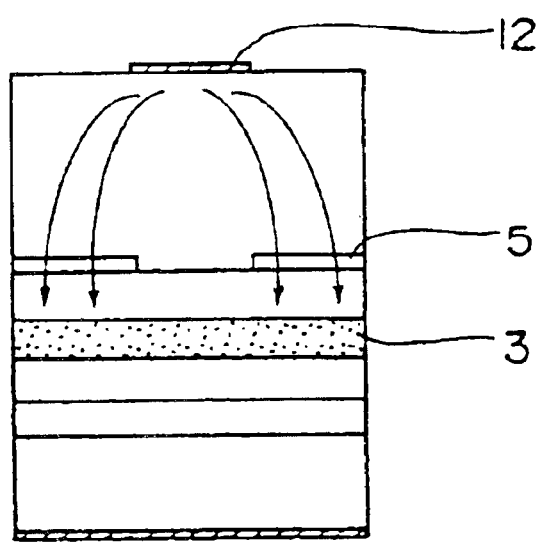
FIG. 1C is a functional view showing a current flow in the semiconductor light-emitting device.

FIGS. 1A, 1B and 1C are a top view, a sectional view, and a functional view showing a current flow, respectively, of a semiconductor light-emitting device which is a first embodiment of the invention.

In this semiconductor light-emitting device, as shown in FIG. 1B, an n-GaAs buffer layer 1 (thickness: 0.5 $\mu$m, Si doping: $5 \times 10^{17}$ cm$^{-3}$), an n-$(Al_{0.7}Ga_{0.3})_{0.5}In_{0.5}P$ first cladding layer 2 (thickness: 1.0 $\mu$m, Si doping: $5 \times 10^{17}$ cm$^{-3}$), an undoped $(Al_{0.3}Ga_{0.7})_{0.5}In_{0.5}P$ active layer 3 (thickness: 0.6 $\mu$m), a p-$(Al_{0.7}Ga_{0.3})_{0.5}In_{0.5}P$ second cladding layer 4 (thickness: 0.7 $\mu$m, Zn doping: $5 \times 10^{17}$ cm$^{-3}$), a p-$(Al_{0.4}Ga_{0.6})_{0.9}In_{0.1}P$ intermediate band gap layer 5 (thickness: 0.15 $\mu$m, Zn doping: $2 \times 10^{18}$ cm$^{-3}$), and a p-GaP current diffusion layer 6 (thickness: 6 $\mu$m, Zn doping: $2 \times 10^{18}$ cm$^{-3}$) are stacked one by one on an n-GaAs substrate 10 by MOCVD process.

In this case, a device center region of the p-AlGaInP intermediate band gap layer 5 is removed in a circular shape (the diameter of this circular-shaped removal region is 100 $\mu$m). Then, a first electrode 11 is formed on the substrate side while a circular-shaped second electrode 12 having a diameter of 100 $\mu$m is formed on the grown layer side (shown in FIG. 1A). It is noted that the p-AlGaInP intermediate band gap layer 5 has a $\Delta a/a = -2.8\%$ mismatch in lattice matching ratio with respect to the n-GaAs substrate 10.

In this semiconductor light-emitting device, as shown in FIG. 1C, a current injected from the grown-layer side second electrode 12 avoids the region at which the p-AlGaInP intermediate band gap layer 5 provided under the second electrode 12 has been removed (removal region), flowing to around the removal region. Thus, light emission occurs over a region of the active layer 3 corresponding to the region other than the removal region (under the second electrode 12). The reason of this is described below.

Figure 2A:
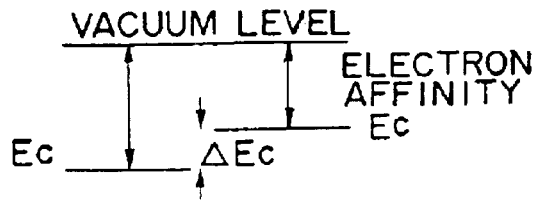
FIGS. 2A to 2C are band junction diagrams for explaining the effects of the invention.

The p-AlGaInP second cladding layer 4 and the p-GaP current diffusion layer 6 are so positioned as to have such a positional relation of their conduction band lower ends and the valence band upper ends with respect to the vacuum level as shown in FIG. 2A. When a heterojunction is formed in this case, there results a junction state of so-called type-II energy band structure which involves an increased band discontinuity of valence band.

Figure 2B:
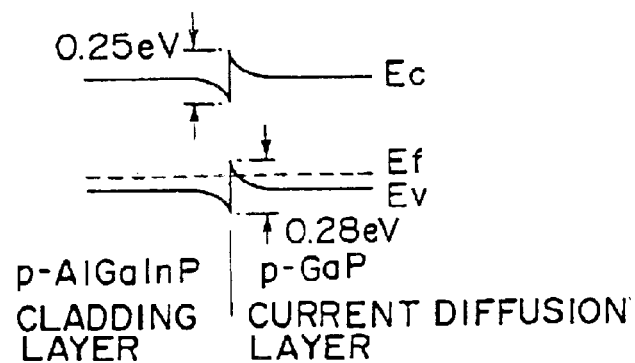

Therefore, as an interface between the p-AlGaInP second cladding layer 4 and the p-GaP current diffusion layer 6 is present in the removal region under the second electrode 12, the band junction state at the interface is as shown in FIG. 2B, where the notch of the valence band at the junction becomes large, causing a high resistance, to the current (holes) injected from the second electrode 12 on the grown layer side (where the notch height is about 0.28 eV).

Figure 2C:
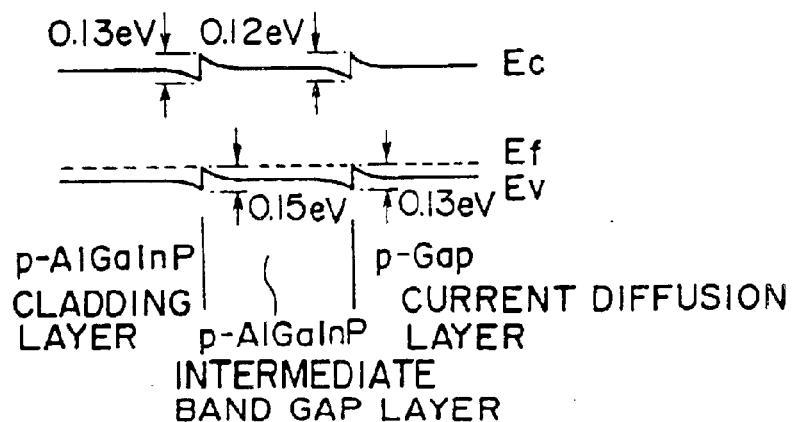

Meanwhile, in the region other than the removal region (under the second electrode 12), the layer structure is given by the p-AlGaInP second cladding layer 4, the p-AlGaInP intermediate band gap layer 5 and the p-GaP current diffusion layer 6, where the band junction state is as shown in FIG. 2C due to the presence of the p-AlGaInP intermediate band gap layer 5. In this case, the band discontinuity is divided with the results of smaller notch of valence band at the junction, causing a low resistance (where the notch is divided into 0.15 eV and 0.13 eV).

Under operation as a device, in the case of a device made up only of the interface between the p-AlGaInP second cladding layer 4 and the p-GaP current diffusion layer 6, as in the removal region under the second electrode 12, the voltage at a 20 mA conduction is about 3.5 V because of a large notch height. Meanwhile, in the case of a semiconductor light-emitting device having the p-AlGaInP intermediate band gap layer 5 device, as in the region other than the removal region (under the second electrode 12), the voltage at a 20 mA conduction is about 2.1 V, hence a voltage difference being as much as 1.4 V.

As a result, at a 20 mA conduction, as shown in FIG. 1C, a current injected from the grown-layer side second electrode 12 avoids the removal region under the second electrode 12, flowing to around the region, causing light emission to occur over a region of the active layer 3 corresponding to the region other than the removal region (under the second electrode 12).

Figure 26A:
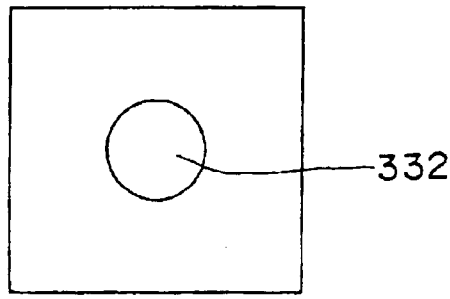
FIG. 26A is a top view of another semiconductor light-emitting device according to the prior art.
Figure 26B:
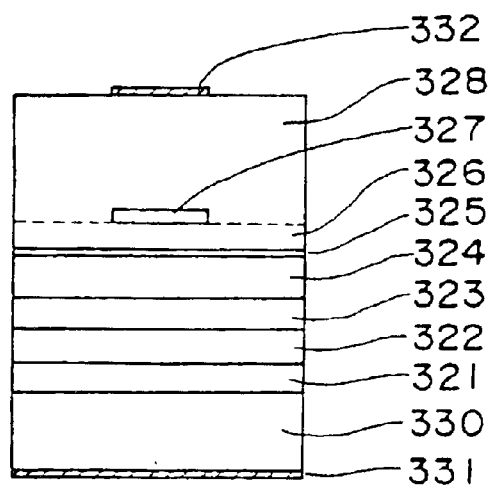
FIG. 26B is a sectional view of the semiconductor light-emitting device.
Figure 26C:
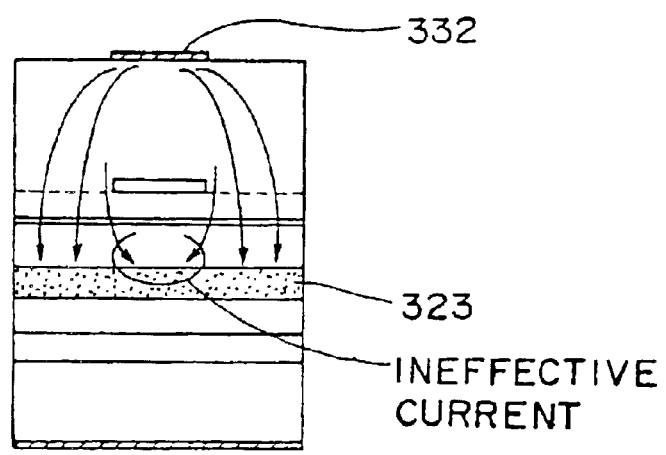
FIG. 26C is a functional view showing a current flow in the semiconductor light-emitting device.

In the case of this semiconductor light-emitting device, as in the semiconductor light-emitting device shown in FIG. 26, there occurs no sneak current to under the current blocking layer, so that ineffective currents are almost completely eliminated, resulting in increased emission intensity.

When this semiconductor light-emitting device of the first embodiment was applied to a 5 mm dia. molded article, the emission intensity at a 20 mA conduction was 3.0 cd, 1.5 times higher than that of the semiconductor light-emitting device shown in FIG. 26.

(Second Embodiment)

Figure 3A:
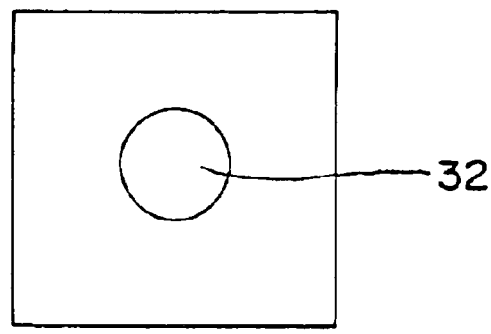
FIG. 3A is a top view of a semiconductor light-emitting device which is a second embodiment of the invention.
Figure 3B:
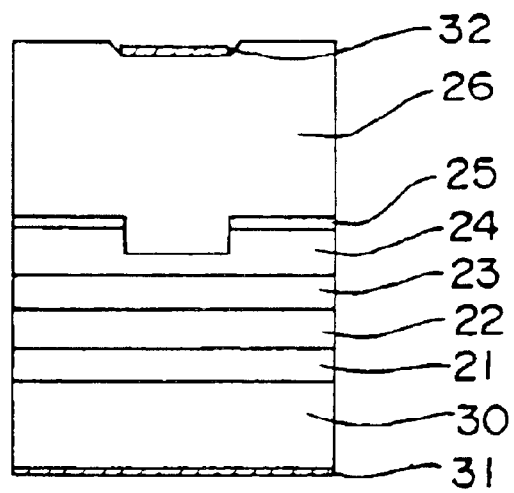
FIG. 3B is a sectional view of the semiconductor light-emitting device.
Figure 3C:
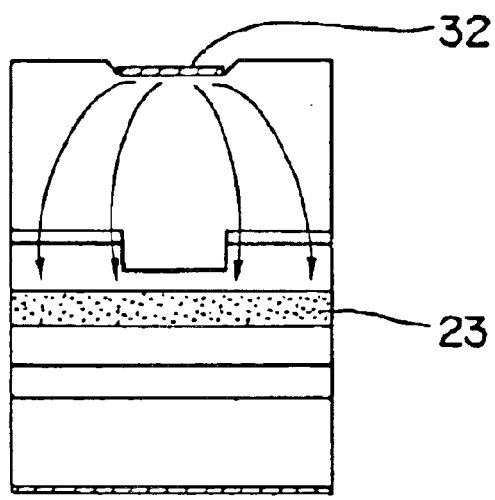
FIG. 3C is a functional view showing a current flow in the semiconductor light-emitting device.

FIGS. 3A, 3B and 3C are a top view, a sectional view and a functional view, respectively, of a semiconductor light-emitting device which is a second embodiment of the invention.

In this semiconductor light-emitting device, as shown in FIG. 3B, an n-GaAs buffer layer 21 (thickness: 0.5 μm, Si doping: $5 \times 10^{17}$ cm$^{-3}$), an n-$(Al_{0.7}Ga_{0.3})_{0.5}In_{0.5}P$ first cladding layer 22 (thickness: 1.0 μm, Si doping: $5 \times 10^{17}$ cm$^{-3}$), an undoped $(Al_{0.3}Ga_{0.7})_{0.5}In_{0.5}P$ active layer 23 (thickness: 0.6 μm), a p-$(Al_{0.7}Ga_{0.3})_{0.5}In_{0.5}P$ second cladding layer 24 (thickness: 0.7 μm, Zn doping: $5 \times 10^{17}$ cm$^{-3}$), a p-$(Al_{0.4}Ga_{0.6})_{0.9}In_{0.1}P$ intermediate band gap layer 25 (thickness: 0.15 μm, Zn doping: $2 \times 10^{18}$ cm$^{-3}$), and a p-GaP current diffusion layer 26 (thickness: 6 μm, Zn doping: $2 \times 10^{17}$ cm$^{-3}$) are stacked one by one on an n-GaAs substrate 30 by MOCVD process.

In this case, a device center region of the p-AlGaInP intermediate band gap layer 25 is removed in a circular shape, and a region of the p-AlGaInP second cladding layer 24 corresponding to the removal region is removed halfway on the upper side (remaining thickness: 0.3 μm) (the diameter of this circular shape is 100 μm). Then, a first electrode 31 is formed on the substrate side while a circular-shaped second electrode 32 having a diameter of 100 μm is formed on the grown layer side.

In this semiconductor light-emitting device, according to the same principle as in the semiconductor light-emitting device of the first embodiment, as shown in FIG. 3C, a current injected from the grown-layer side second electrode 32 avoids the removal region under the second electrode 32, flowing to around the removal region. Thus, light emission occurs over a region of the active layer 23 corresponding to the region other than the removal region (under the second electrode 32).

In the case of this semiconductor light-emitting device, as compared with the semiconductor light-emitting device of the first embodiment, the high-resistance interface formed by the p-AlGaInP second cladding layer 24 and the p-GaP current diffusion layer 26 under the second electrode 32 is just above the active layer 23 as near as 0.3 μm thereto, so that ineffective currents are lessened, resulting in further increased emission intensity.

When this semiconductor light-emitting device of the second embodiment was applied to a 5 mm dia. molded article, the emission intensity at a 20 mA conduction (operating voltage: 2.1 V) was 3.3 cd, showing a 10% increase as compared with the semiconductor light-emitting device of the first embodiment.

(Third Embodiment)

Figure 4A:
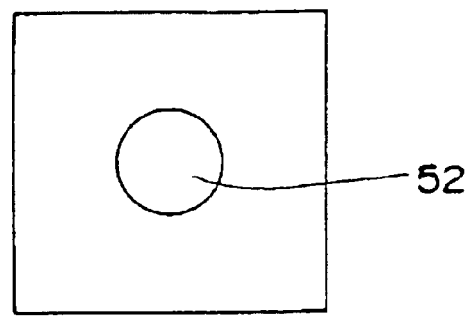
FIG. 4A is a top view of a semiconductor light-emitting device which is a third embodiment of the invention.
Figure 4B:
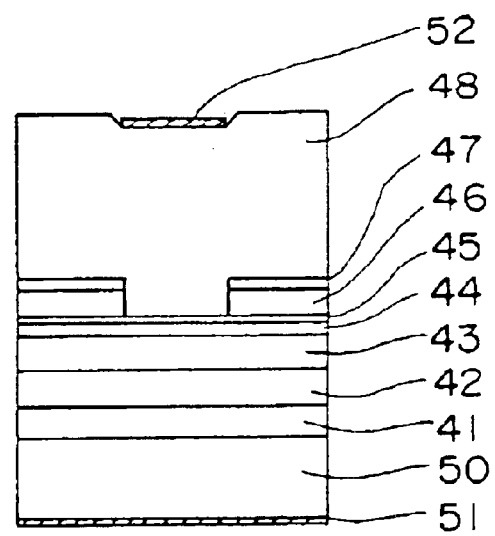
FIG. 4B is a sectional view of the semiconductor light-emitting device.
Figure 4C:
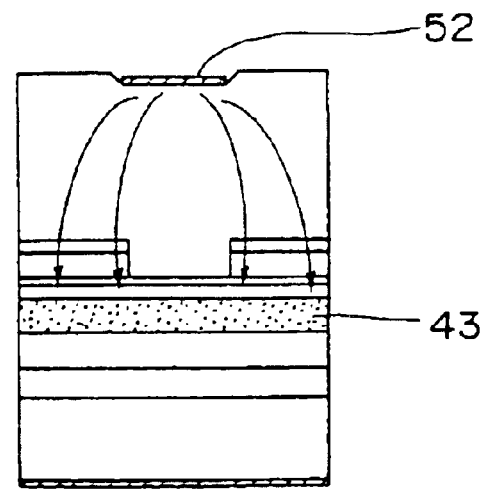
FIG. 4C is a functional view showing a current flow in the semiconductor light-emitting device.

FIGS. 4A, 4B and 4C are a top view, a sectional view and a functional view, respectively, of a semiconductor light-emitting device which is a third embodiment of the invention. In this semiconductor light-emitting device, as shown in FIGS. 4A and 4B, an n-GaAs buffer layer 41 (thickness: 0.5 μm, Si doping: $5 \times 10^{17}$ cm$^{-3}$), an n-$(Al_{0.7}Ga_{0.3})_{0.5}In_{0.5}P$ first cladding layer 42 (thickness: 1.0 μm, Si doping: $5 \times 10^{17}$ cm$^{-3}$), an undoped $(Al_{0.3}Ga_{0.7})_{0.5}In_{0.5}P$ active layer 43 (thickness: 0.6 μm), a p-$(Al_{0.7}Ga_{0.3})_{0.5}In_{0.5}P$ second cladding layer 44 (thickness: 0.3 μm), a p-GaInP etching stop layer 45 (thickness: 0.01 μm, Zn doping: $5 \times 10^{17}$ cm$^{-3}$), a p-$(Al_{0.7}Ga_{0.3})_{0.5}In_{0.5}P$ third cladding layer 46 (thickness: 0.4 μm, Zn doping: $5 \times 10^{17}$ cm$^{-3}$), a p-$(Al_{0.4}Ga_{0.6})_{0.9}In_{0.1}P$ intermediate band gap layer 47 (thickness: 0.15 μm, Zn doping: $2 \times 10^{18}$ cm$^{-3}$), and a p-GaP current diffusion layer 48 (thickness: 6 μm, Zn doping: $2 \times 10^{18}$ cm$^{-3}$) are stacked one by one on an n-GaAs substrate 50 by MOCVD process.

In this case, device center regions of the p-AlGaInP intermediate band gap layer 47 and the p-AlGaInP third cladding layer 46 are removed in a circular shape (the diameter of these circular-shaped removal regions is 100 μm). Then, a first electrode 51 is formed on the substrate side while a circular-shaped second electrode 52 having a diameter of 100 μm is formed on the grown layer side.

In this semiconductor light-emitting device also, as shown in FIG. 4C, a current injected from the grown-layer side second electrode 52 avoids the removal region under the second electrode 52, flowing to around the removal region. Thus, light emission occurs over a region of the active layer 43 corresponding to the region other than the removal region (under the second electrode 52).

As to the reason of this, also at the interface between the p-GaInP etching stop layer 45 and the p-GaP current diffusion layer 48 present in the etched region under the second electrode 52, the band junction state is one similar to FIG. 2B, where the notch at the junction becomes large, causing a high resistance, to the current (holes) injected from the second electrode 52 on the grown layer side (where the notch height is about 0.26 eV and the voltage at a 20 mA conduction is as large as 3.3 V).

This semiconductor light-emitting device of the third embodiment has effects similar to those of the semiconductor light-emitting device of the second embodiment, and further has better controllability in forming, at a position 0.3 $\mu$m just above the active layer 43, the high-resistance interface formed by the p-AlGaInP second cladding layer 44 and the p-GaP current diffusion layer 48 under the second electrode 52, as compared with the semiconductor light-emitting device of the second embodiment, by virtue of the use of the p-GaInP etching stop layer 45. Thus, the yield of this semiconductor light-emitting device is improved.

With this semiconductor light-emitting device of the third embodiment, the emission intensity at a 20 mA conduction (operating voltage: 2.1 V) was 3.3 cd, the same as in the semiconductor light-emitting device of the second embodiment, while the yield was improved to 99% in contrast to 75% of the second embodiment.

(Fourth Embodiment)

Figure 5A:
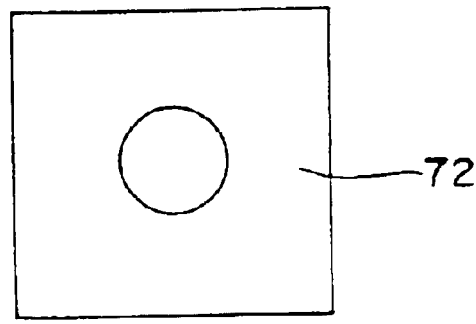
FIG. 5A is a top view of a semiconductor light-emitting device which is a fourth embodiment of the invention.
Figure 5B:
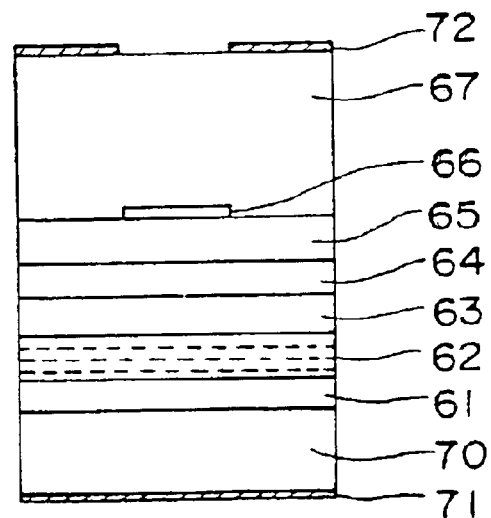
FIG. 5B is a sectional view of the semiconductor light-emitting device.
Figure 5C:
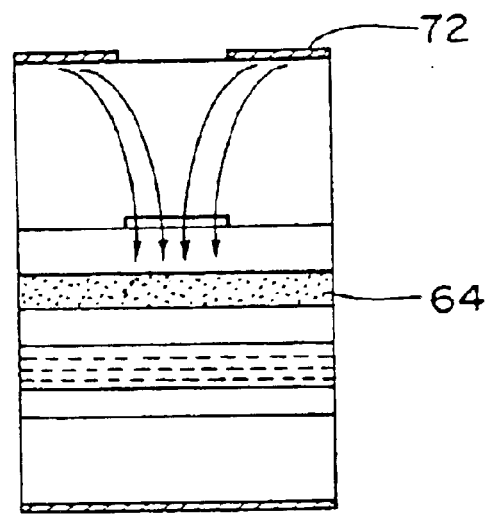
FIG. 5C is a functional view showing a current flow in the semiconductor light-emitting device.

FIGS. 5A, 5B and 5C are a top view, a sectional view and a functional view, respectively, of a semiconductor light-emitting device which is a fourth embodiment of the invention.

In this semiconductor light-emitting device, as shown in FIGS. 5A and 5B, an n-GaAs buffer layer 61 (thickness: 0.5 $\mu$m, Si doping: $5\times10^{17}$ cm$^{-3}$), a DBR (optical reflection) layer 62 formed of ten pairs of n-Al$_{0.5}$In$_{0.5}$P layer and n-(Al$_{0.4}$Ga$_{0.6}$)$_{0.5}$In$_{0.5}$P layer (each one layer's thickness: 0.05 $\mu$m, Si doping: $5\times10^{17}$ cm$^{-3}$), an n-(Al$_{0.7}$Ga$_{0.3}$)$_{0.5}$In$_{0.5}$P first cladding layer 63 (thickness: 1.0 $\mu$m, Si doping: $5\times10^{17}$ cm$^{-3}$), a p-(Al$_{0.3}$Ga$_{0.7}$)$_{0.5}$In$_{0.5}$P active layer 64 (thickness: 0.6 $\mu$m, Zn doping: $2\times10^{17}$ cm$^{-3}$), a p-(Al$_{0.7}$Ga$_{0.3}$)$_{0.5}$In$_{0.5}$P second cladding layer 65 (thickness: 0.7 $\mu$m, Zn doping: $5\times10^{17}$ cm$^{-3}$), a p-(Al$_{0.4}$Ga$_{0.6}$)$_{0.9}$In$_{0.1}$P intermediate band gap layer 66 (thickness: 0.15 $\mu$m, Zn doping: $2\times10^{18}$ cm$^{-3}$), and a p-(Al$_{0.05}$Ga$_{0.95}$)$_{0.9}$In$_{0.1}$P current diffusion layer 67 (thickness: 6 $\mu$m, Zn doping: $3\times10^{18}$ cm$^{-3}$) are stacked one by one on an n-GaAs substrate 70 by MOCVD process.

In this case, peripheries of the p-AlGaInP intermediate band gap layer 66 are removed with its device center region left in a circular shape (the diameter of this circular shape is 100 $\mu$m). Then, a first electrode 71 is formed on the substrate side while a second electrode 72 is formed on the grown layer side over a region other than a 100 $\mu$m dia. circular-shaped region which is left as it is.

A heterojunction of type II is formed also between the p-(Al$_{0.5}$Ga$_{0.95}$)$_{0.9}$In$_{0.1}$P current diffusion layer 67 and the p-(Al$_{0.7}$Ga$_{0.3}$)$_{0.5}$In$_{0.5}$P second cladding layer 65, and a high-resistance interface is formed at the removal region of the intermediate band gap layer 66.

In the case of this semiconductor light-emitting device, as shown in FIG. 5C, a current injected from the grown-layer side second electrode 72 avoids the removal region under the second electrode 72, flowing to the device center region. Thus, light emission occurs over a region of the active layer 64 corresponding to the region other than the removal region (under the second electrode 72).

Figure 27A:
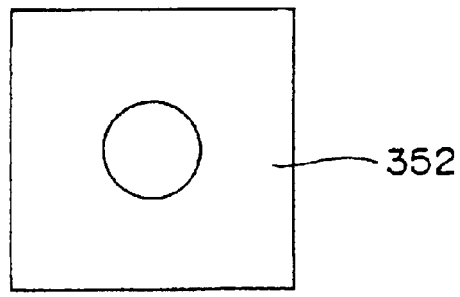
FIG. 27A is a top view of still another semiconductor light-emitting device according to the prior art.
Figure 27B:
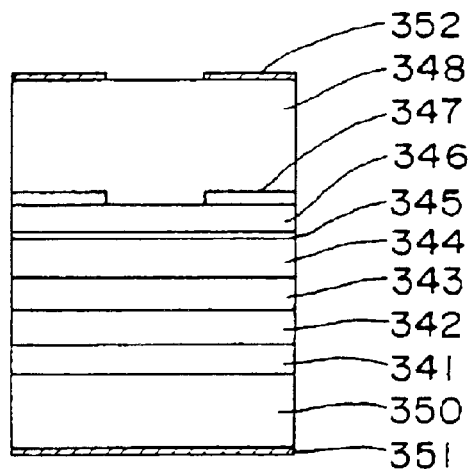
FIG. 27B is a sectional view of the semiconductor light-emitting device.
Figure 27C:
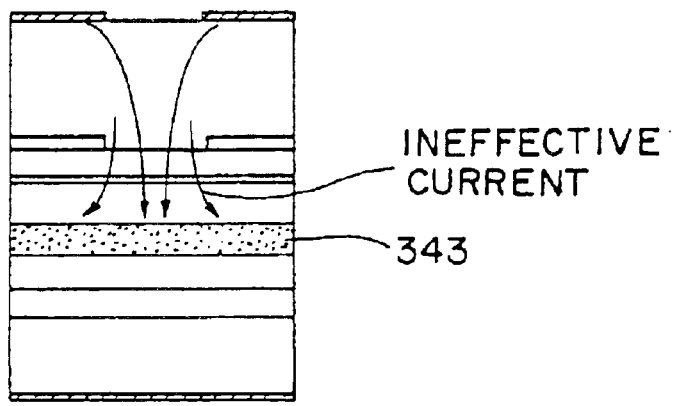
FIG. 27C is a functional view showing a current flow in the semiconductor light-emitting device.

As a structure to be compared with this semiconductor light-emitting device, there has been a semiconductor light-emitting device having a structure shown in FIGS. 27A–27C similar to the prior-art semiconductor light-emitting device shown in FIG. 26. In this semiconductor light-emitting device shown in FIGS. 27A–27C, as in the semiconductor light-emitting device shown in FIG. 26, most part of the current sneaks to under the second electrode on the under side of the current blocking layer, resulting in ineffective current, with lower light intensity (4 cd at a 20 mA conduction with a radiation angle of ±2°). As compared with this semiconductor light-emitting device shown in FIGS. 27A–27C, the semiconductor light-emitting device of this fourth embodiment involves less sneak current going to under the removal region, so that ineffective currents are almost completely eliminated, resulting in increased emission intensity.

Figure 25A:
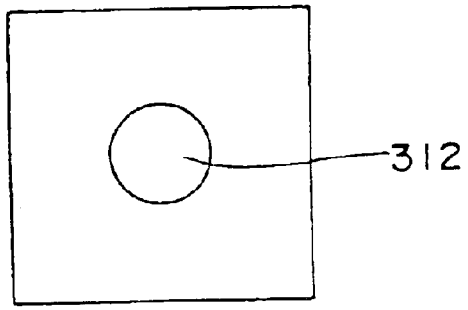
FIG. 25A is a top view of a semiconductor light-emitting device according to the prior art.
Figure 25B:
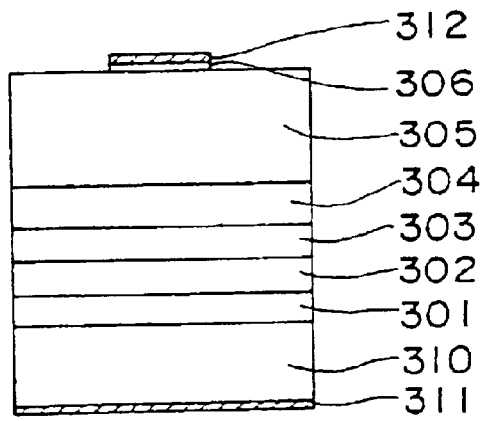
FIG. 25B is a sectional view of the semiconductor light-emitting device.
Figure 25C:
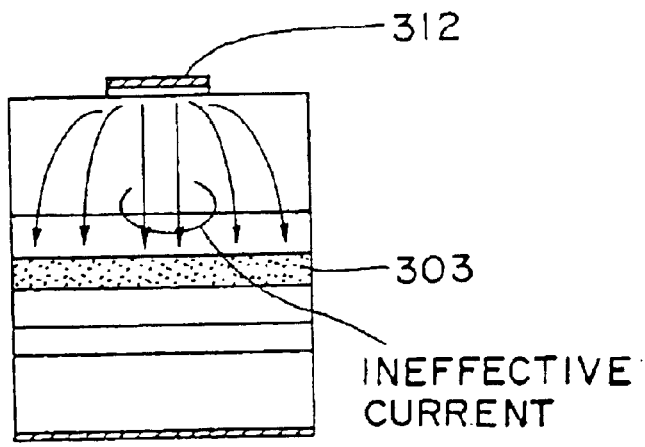
FIG. 25C is a functional view showing a current flow in the semiconductor light-emitting device.

With this semiconductor light-emitting device of the fourth embodiment, the emission intensity at a 20 mA conduction was 6.0 cd, 1.5 times higher than that of the semiconductor light-emitting device shown in FIG. 27, where the operating voltage was 2.35 V (because of a small current injection area, the operating voltage is larger than in the semiconductor light-emitting device shown in FIG. 25).

(Fifth Embodiment)

Figure 6A:
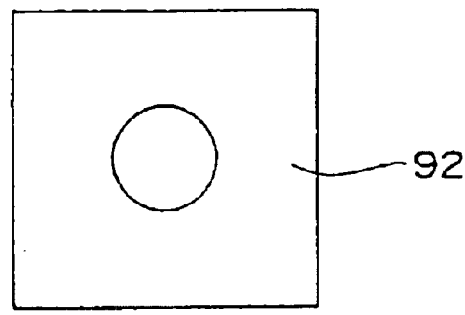
FIG. 6A is a top view of a semiconductor light-emitting device which is a fifth embodiment of the invention.
Figure 6B:
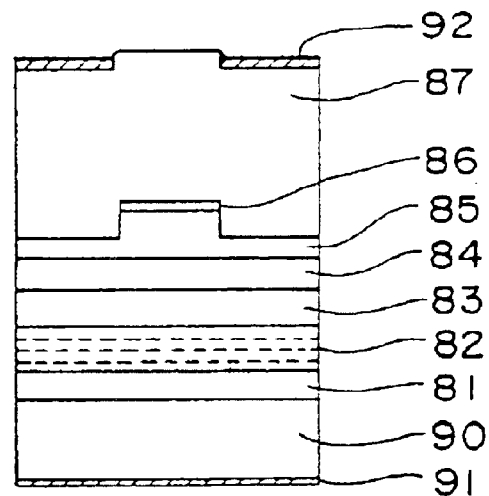
FIG. 6B is a sectional view of the semiconductor light-emitting device.
Figure 6C:
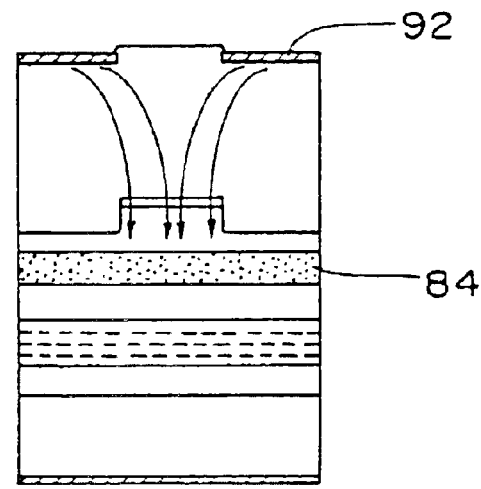
FIG. 6C is a functional view showing a current flow in the semiconductor light-emitting device.

FIGS. 6A, 6B and 6C are a top view, a sectional view and a functional view, respectively, of a semiconductor light-emitting device which is a fifth embodiment of the invention.

In this semiconductor light-emitting device, as shown in FIGS. 6A and 6B, an n-GaAs buffer layer 81 (thickness: 0.5 $\mu$m, Si doping: $5\times10^{17}$ cm$^{-3}$), a DBR (optical reflection) layer 82 formed of ten pairs of n-Al$_{0.5}$In$_{0.5}$P layer and n-(Al$_{0.4}$Ga$_{0.6}$)$_{0.5}$In$_{0.5}$P layer (each one layer's thickness: 0.05 $\mu$m, Si doping: $5\times10^{17}$ cm$^{-3}$), an n-(Al$_{0.7}$Ga$_{0.3}$)$_{0.5}$In$_{0.5}$P first cladding layer 83 (thickness: 1.0 $\mu$m, Si doping: $5\times10^{17}$ cm$^{-3}$), a p-(Al$_{0.3}$Ga$_{0.7}$)$_{0.5}$In$_{0.5}$P active layer 84 (thickness: 0.6 $\mu$m, Zn doping: $2\times10^{17}$ cm$^{-3}$), a p-(Al$_{0.7}$Ga$_{0.3}$)$_{0.5}$In$_{0.5}$P second cladding layer 85 (thickness: 0.7 $\mu$m, Zn doping: $5\times10^{17}$ cm$^{-3}$), a p-(Al$_{0.4}$Ga$_{0.6}$)$_{0.9}$In$_{0.1}$P intermediate band gap layer 86 (thickness: 0.15 $\mu$n, Zn doping: $2\times10^{18}$ cm$^{-3}$), and a p-(Al$_{0.05}$Ga$_{0.95}$)$_{0.9}$In$_{0.1}$P current diffusion layer 87 (thickness: 6 $\mu$m, Zn doping: $3\times10^{18}$ cm$^{-3}$) are stacked one by one on an n-GaAs substrate 90 by MOCVD process.

In this case, peripheries of the p-AlGaInP intermediate band gap layer 86 are removed with its device center region left in a circular shape, and a region of the p-AlGaInP second cladding layer 85 corresponding to the removal region is removed halfway on the upper side (remaining thickness: 0.3 $\mu$m) (the diameter of this circular shape is 100 $\mu$m). Then, a first electrode 91 is formed on the substrate side while a second electrode 92 is formed on the grown layer side over a region other than a 100 $\mu$m dia. circular-shaped region which is left as it is.

In the case of this semiconductor light-emitting device, as shown in FIG. 6C, a current injected from the grown-layer side second electrode 92 avoids the removal region under the second electrode 92, flowing to the device center region. Thus, light emission occurs over a region of the active layer 84 corresponding to the region other than the removal region (under the second electrode 92).

This semiconductor light-emitting device of the fifth embodiment has effects similar to those of the semiconductor light-emitting device of the fourth embodiment, and further, as compared with the semiconductor light-emitting device of the fourth embodiment, the high-resistance interface formed by the p-AlGaInP second cladding layer 85 and the p-AlGaInP current diffusion layer 87 under the second electrode 92 is just above the active layer 84 as near as 0.3 $\mu$m thereto, so that ineffective currents are lessened, resulting in further increased emission intensity. The emission intensity at a 20 mA conduction (operating voltage: 2.35 V) was 6.6 cd, showing a 10% increase as compared with the semiconductor light-emitting device of the first embodiment.

(Sixth Embodiment)

Figure 7A:
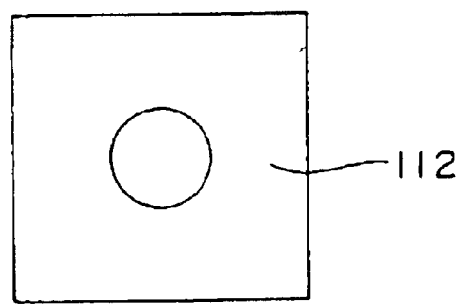
FIG. 7A is a top view of a semiconductor light-emitting device which is a sixth embodiment of the invention, FIG.
Figure 7B:
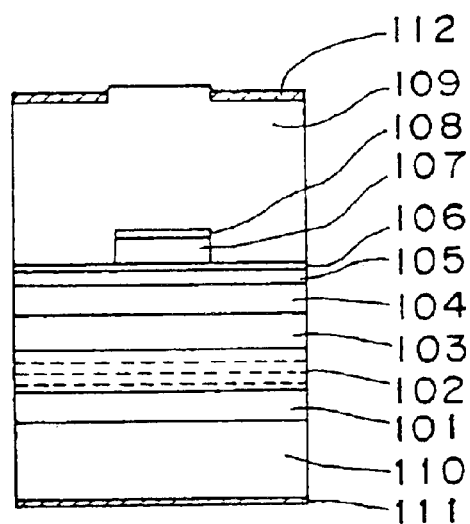
FIG. 7C is a functional view showing a current flow in the semiconductor light-emitting device.
Figure 7C:
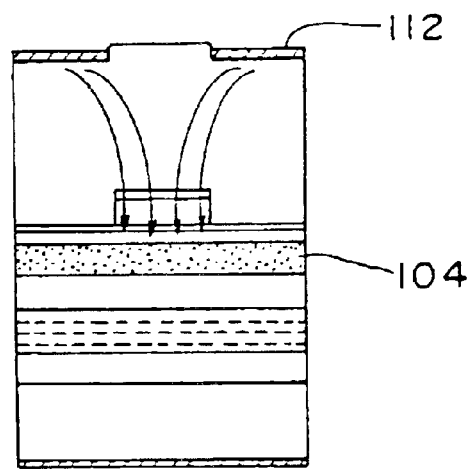

FIGS. 7A, 7B and 7C are a top view, a sectional view and a functional view, respectively, of a semiconductor light-emitting device which is a sixth embodiment of the invention.

In this semiconductor light-emitting device, as shown in FIGS. 7A and 7B, an n-GaAs buffer layer 101 (thickness: 0.5

μm, Si doping: $5\times10^{17}$ cm$^{-3}$), a DBR (optical reflection) layer 102 formed of ten pairs of n-Al$_{0.5}$In$_{0.5}$P layer and n-(Al$_{0.4}$Ga$_{0.6}$)$_{0.5}$In$_{0.5}$P layer (each one layer's thickness: 0.05 μm, Si doping: $5\times10^{17}$ cm$^{-3}$), an n-(Al$_{0.7}$Ga$_{0.3}$)$_{0.5}$In$_{0.5}$P first cladding layer 103 (thickness: 1.0 μm, Si doping: $5\times10^{17}$ cm$^{-3}$), a p-(Al$_{0.3}$Ga$_{0.7}$)$_{0.5}$In$_{0.5}$P active layer 104 (thickness: 0.6 μm, Zn doping: $2\times10^{17}$ cm$^{-3}$), a p-(Al$_{0.7}$Ga$_{0.3}$)$_{0.5}$In$_{0.5}$P second cladding layer 105 (thickness: 0.3, Zn doping: $5\times10^{17}$ cm$^{-3}$), a p-Ga$_{0.5}$In$_{0.5}$P etching stop layer 106 (thickness: 0.01 μm, Zn doping: $5\times10^{17}$ cm$^{-3}$), a p-(Al$_{0.7}$Ga$_{0.3}$)$_{0.5}$In$_{0.5}$P third cladding layer 107 (thickness: 0.4 μm, Zn doping: $5\times10^{17}$ cm$^{-3}$), a p-(Al$_{0.4}$Ga$_{0.6}$)$_{0.9}$In$_{0.1}$P intermediate band gap layer 108 (thickness: 0.15 μm, Zn doping: $2\times10^{18}$ cm$^{-3}$), and a p-(Al$_{0.05}$Ga$_{0.95}$)$_{0.9}$In$_{0.1}$P current diffusion layer 109 (thickness: 6 μm, Zn doping: $3\times10^{18}$ cm$^{-3}$) are stacked one by one on an n-GaAs substrate 110 by MOCVD process.

In this case, peripheries of the p-AlGaInP intermediate band gap layer 108 are removed with its device center region left in a circular shape, and a region of the p-AlGaInP third cladding layer 107 corresponding to the removal region is removed (the diameter of this circular shape is 100 μm). Then, a first electrode 111 is formed on the substrate side while a second electrode 112 is formed on the grown layer side over a region other than a 100 μm dia. circular-shaped region which is left as it is.

In the case of this semiconductor light-emitting device, as shown in FIG. 7C, a current injected from the grown-layer side second electrode 112 avoids the removal region under the second electrode 112, flowing to the device center region. Thus, light emission occurs over a region of the active layer 104 corresponding to the region other than the removal region (under the second electrode 112).

This semiconductor light-emitting device of the sixth embodiment has effects similar to those of the semiconductor light-emitting device of the fifth embodiment, and further, has better controllability in forming, at a position 0.3 μm just above the active layer 104, the high-resistance interface formed by the p-AlGaInP third cladding layer 107 and the p-AlGaInP current diffusion layer 109 under the second electrode 112, as compared with the semiconductor light-emitting device of the fifth embodiment, by virtue of the use of the etching stop layer 106. Thus, the yield of this semiconductor light-emitting device is improved.

With this semiconductor light-emitting device of the sixth embodiment, the emission intensity at a 20 mA conduction (operating voltage: 2.35 V) was 6.6 cd, the same as in the semiconductor light-emitting device of the fifth embodiment, while the yield was improved to 99% (against 75% of the semiconductor light-emitting device of the fifth embodiment).

(Seventh Embodiment)

Figure 8A:
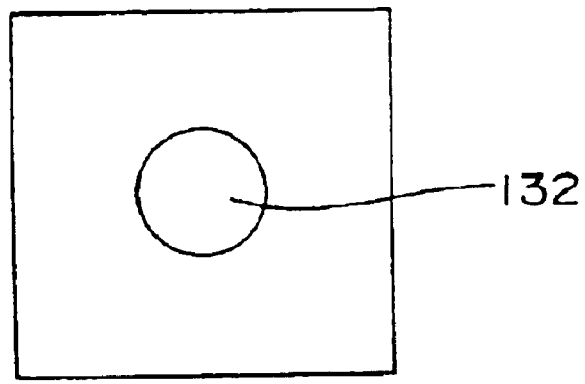
FIG. 8A is a top view of a semiconductor light-emitting device which is a seventh embodiment of the invention.
Figure 8B:
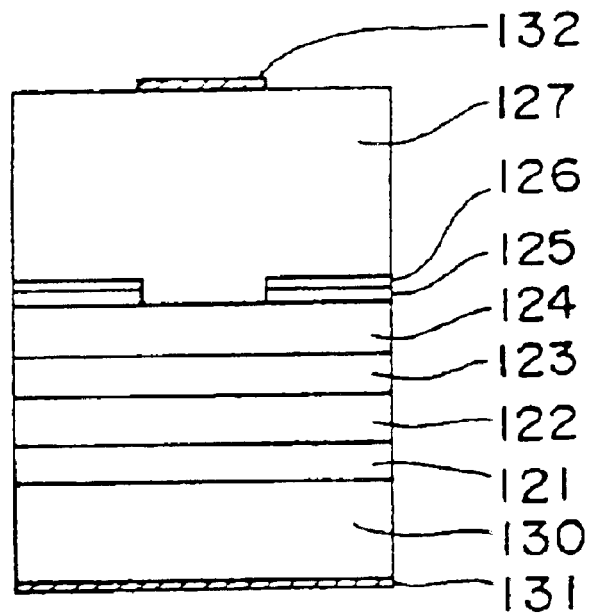
FIG. 8B is a sectional view of the semiconductor light-emitting device.

FIGS. 8A and 8B are a top view and a sectional view, respectively, of a semiconductor light-emitting device which is a seventh embodiment of the invention.

In this semiconductor light-emitting device, as shown in FIGS. 8A and 8B, an n-GaAs buffer layer 121 (thickness: 0.5 μm, Si doping: $5\times10^{17}$ cm$^{-3}$), an n-(Al$_{0.7}$Ga$_{0.3}$)$_{0.5}$In$_{0.5}$P first cladding layer 122 (thickness: 1.0 μm, Si doping: $5\times10^{17}$ cm$^{-3}$), an undoped (Al$_{0.3}$Ga$_{0.7}$)$_{0.5}$In$_{0.5}$P active layer 123 (thickness: 0.6 μm), a p-(Al$_{0.7}$Ga$_{0.3}$)$_{0.5}$In$_{0.5}$P second cladding layer 124 (thickness: 0.7 μm, Zn doping: $5\times10^{17}$ cm$^{-3}$), a p-(Al$_{0.4}$Ga$_{0.6}$)$_{0.9}$In$_{0.1}$P intermediate band gap layer 125 (thickness: 0.15 μm, Zn doping: $2\times10^{18}$ cm$^{-3}$), a p-GaP protective layer 126 (thickness: 0.1 μm, Zn doping: $1\times10^{18}$ cm$^{-3}$), and a p-GaP current diffusion layer 127 (thickness: 6 μm, Zn doping: $2\times10^{18}$ cm$^{-3}$) are stacked one by one on an n-GaAs substrate 130 by MOCVD process.

In this case, device center regions of the p-GaP protective layer 126 and the p-AlGaInP intermediate band gap layer 125 are removed in a circular shape (the diameter of these circular-shaped removal regions is 100 μm). Then, a first electrode 131 is formed on the substrate side while a second electrode 132 having a diameter of 100 μm is formed on the grown layer side over a region opposite to the removal region (shown in FIG. 8A).

This semiconductor light-emitting device of the seventh embodiment differs from the semiconductor light-emitting device of the first embodiment shown in FIG. 1 in that the p-GaP protective layer 126 is present on the p-AlGaInP intermediate band gap layer 125.

In the case of this semiconductor light-emitting device, a current injected from the grown-layer side second electrode 132 avoids the regions at which the p-GaP protective layer 126 and the p-AlGaInP intermediate band gap layer 125 provided under the second electrode 132 have been removed, flowing to around the removal region. Thus, light emission occurs over a region of the active layer 123 corresponding to the region other than the removal region (under the second electrode 132).

With this semiconductor light-emitting device, the operating voltage at 20 mA was 2.0 V, which was a decrease of 0.1 V as compared with the semiconductor light-emitting device of the first embodiment. This is because whereas the ground of the regrown interface in the region through which the current flows in the case of the semiconductor light-emitting device of the first embodiment is given by the p-AlGaInP intermediate band gap layer 125, which is a layer containing much Al (36% on the basis of a total of III group), the counterpart in the case of this semiconductor light-emitting device of the seventh embodiment is given by the p-GaP protective layer 126, which is a layer containing no Al, so that there occurs no resistive layer due to any Al oxide at the interface.

When this semiconductor light-emitting device of the seventh embodiment was applied to a 5 mm dia. molded article, the emission intensity at a 20 mA conduction was 3.0 cd, the same as in the semiconductor light-emitting device of the first embodiment.

(Eighth Embodiment)

Figure 9A:
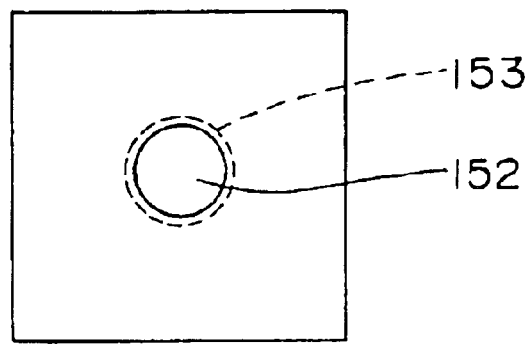
FIG. 9A is a top view of a semiconductor light-emitting device which is an eighth embodiment of the invention.
Figure 9B:
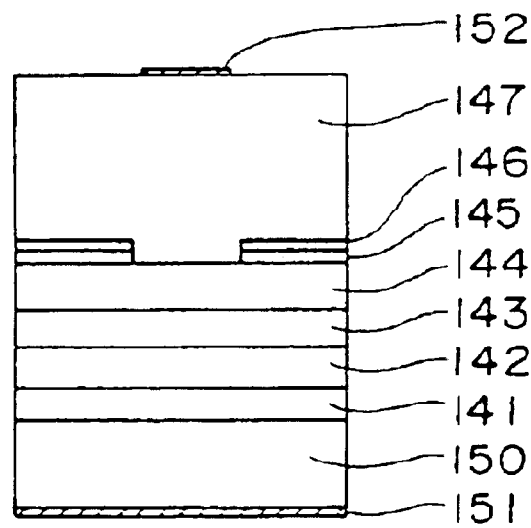
FIG. 9B is a sectional view of the semiconductor light-emitting device.
Figure 9C:
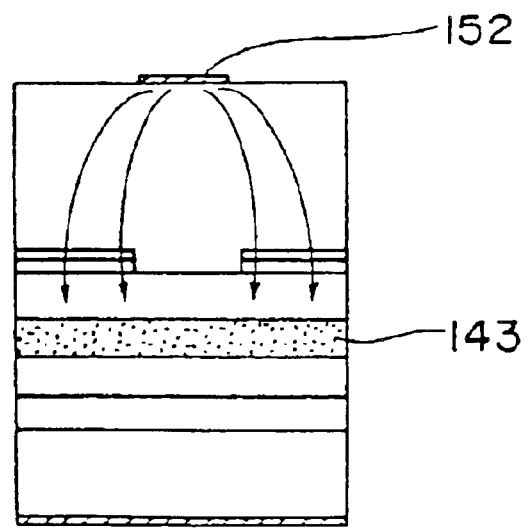
FIG. 9C is a functional view showing a current flow in the semiconductor light-emitting device.

FIGS. 9A, 9B and 9C are a top view, a sectional view and a functional view, respectively, of a semiconductor light-emitting device which is an eighth embodiment of the invention.

In this semiconductor light-emitting device, as shown in FIGS. 9A and 9B, an n-GaAs buffer layer 141 (thickness: 0.5 μm, Si doping: $5\times10^{17}$ cm$^{-3}$), an n-(Al$_{0.7}$Ga$_{0.3}$)$_{0.5}$In$_{0.5}$P first cladding layer 142 (thickness: 1.0 μm, Si doping: $5\times10^{17}$ cm$^{-3}$), an undoped (Al$_{0.3}$Ga$_{0.7}$)$_{0.5}$In$_{0.5}$P active layer 143 (thickness: 0.6 μm), a p-(Al$_{0.7}$Ga$_{0.3}$)$_{0.5}$In$_{0.5}$P second cladding layer 144 (thickness: 0.7, Zn doping: $5\times10^{17}$ cm$^{-3}$), a p-(Al$_{0.4}$Ga$_{0.6}$)$_{0.9}$In$_{0.1}$P intermediate band gap layer 145 (thickness: 0.15 μm, Zn doping: $2\times10^{18}$ cm$^{-3}$), a p-GaP protective layer 146 (thickness: 0.1 μm, Zn doping: $1\times10^{18}$ cm$^{-3}$), and a p-GaP current diffusion layer 147 (thickness: 6 μm, Zn doping: $2\times10^{18}$ cm$^{-3}$) are stacked one by one on an n-GaAs substrate 150 by MOCVD process.

In this case, device center regions of the p-GaP protective layer 146 and the p-AlGaInP intermediate band gap layer 145 are removed in a circular shape (the diameter of these circular-shaped removal regions 153 is 100 μm). Then, a first electrode 151 is formed on the substrate side while a second electrode 152 is formed on the grown layer side over a region opposite to the removal region.

This semiconductor light-emitting device of the eighth embodiment has a 80 μm diameter of the grown-layer side second electrode 152, 20 μm smaller than that of the semiconductor light-emitting device of the seventh embodiment shown in FIG. 8 (the electrode diameter in the first embodiment is 100 μm).

In the case of this semiconductor light-emitting device, as shown in FIG. 9C, a current injected from the grown-layer side second electrode 152 avoids the removal region present under the second electrode 152, flowing to around the removal region. Thus, light emission occurs over a region of the active layer 143 corresponding to the region other than the removal region (under the second electrode 152). However, since there is a positional shift of 10 μm between the end of the second electrode 152 and the end of the removal region (center region), the current spreading becomes slightly worse than in the seventh embodiment (in which the electrode end and the removal region end are coincident).

With this semiconductor light-emitting device of the eighth embodiment, the emission intensity at a 20 mA conduction was 2.7 cd, which is 90% that of the semiconductor light-emitting device shown in the seventh embodiment shown in FIG. 8.

Figure 10:
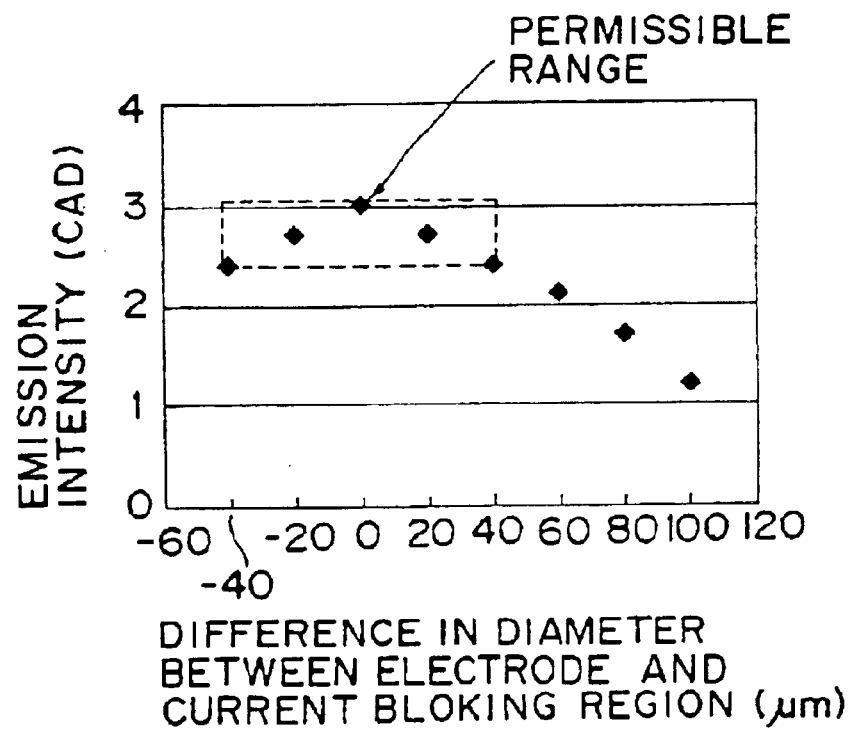
FIG. 10 is a chart showing variations in emission intensity versus the difference in diameter between electrode and current blocking (removal) region in the semiconductor light-emitting device.

FIG. 10 shows the relationship of the light intensity of the eighth embodiment device to the difference between electrode diameter (the diameter of the second electrode 152) and current blocking region diameter (the diameter of the removal region). In FIG. 10, the minus sign represents that the electrode diameter is smaller than the current blocking region diameter, and the plus sign represents that it is larger, conversely.

As can be understood from FIG. 10, in the case where the electrode diameter is larger than the current blocking region diameter converse to the semiconductor light-emitting device of the eighth embodiment, there is formed a light emitting region under the electrode, causing the light intensity to become smaller.

If the difference between the electrode diameter and the current blocking region diameter is within ±40 μm, then the resulting light intensity is 80% or more that in the case where the two diameters are equal to each other.

Figure 11:
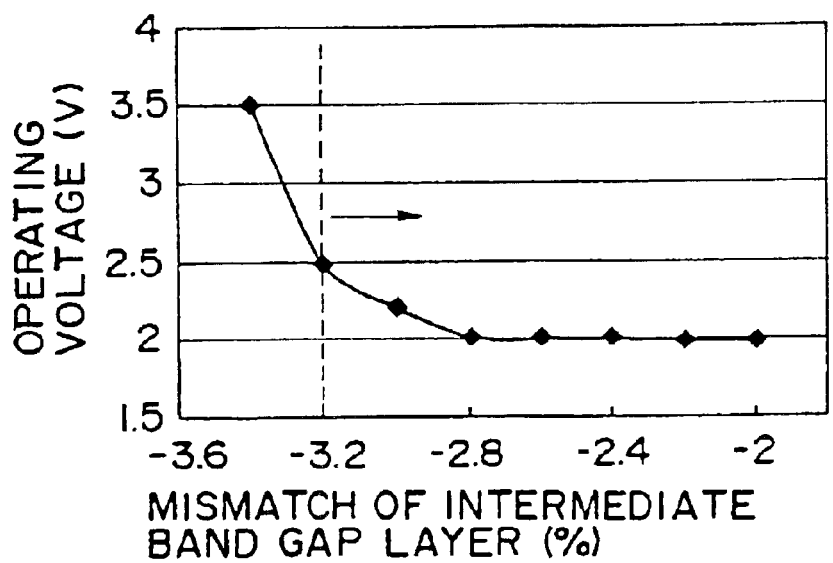
FIG. 11 is a chart showing the relationship between mismatch of the intermediate band gap layer and operating voltage in the semiconductor light-emitting device.

Also, FIG. 11 shows the 20 mA operating voltage of the eighth embodiment resulting when the mismatch (in composition) of the intermediate band gap layer 145 is varied. The operating voltage increases as the mismatch becomes smaller than −2.8% (meaning that the composition approaches GaP). This is because, with reference to the band junction diagram shown by FIG. 2C, the notch of the valence band at the interface of the p-AlGaInP cladding layer and the p-AlGaInP intermediate layer increases. Desirably, the mismatch of the intermediate band gap is not less than −3.2% in order that the operating voltage is not more than 2.5 V, which is practically free from any problems.

Figure 12:
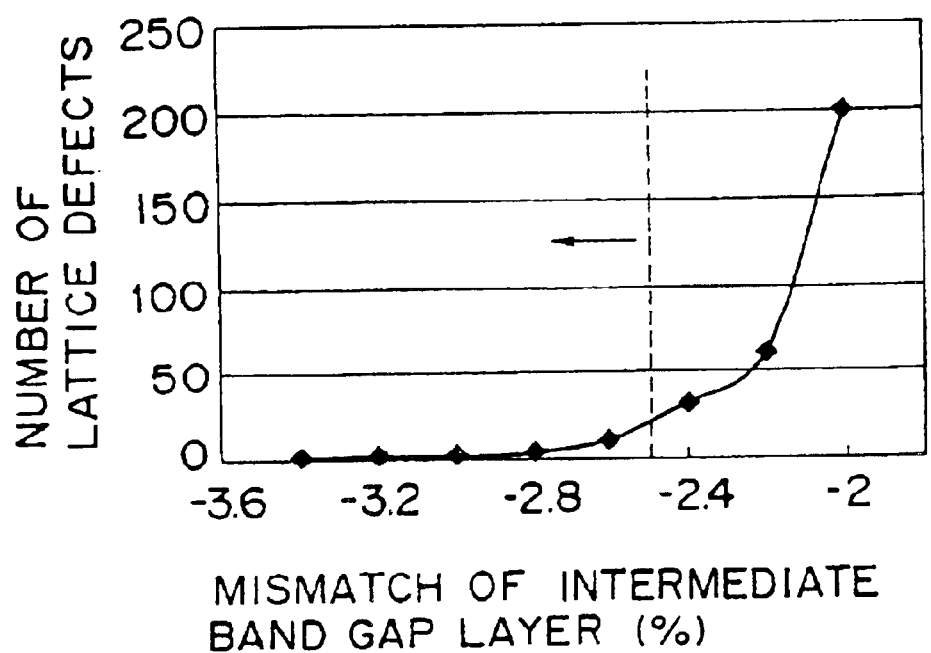
FIG. 12 is a chart showing the relationship between mismatch of the intermediate band gap layer and the number of lattice defects in the semiconductor light-emitting device.

Also, FIG. 12 shows the number of defects (per mm$^2$) at the crystal surface of the first embodiment resulting when the mismatch (in composition) of the intermediate band gap layer is varied. The crystal defects increase as the mismatch becomes larger than −2.8% (meaning that the In composition increases). This is because, at a mismatched layer such as the intermediate layer, In hardly migrates but tends to anisotropically grow because of some stress. Desirably, the mismatch of the intermediate band gap is not more than −2.5% in order that the number of defects is not more than 20, which is practically free from any problems.

(Ninth Embodiment)

Figure 13A:
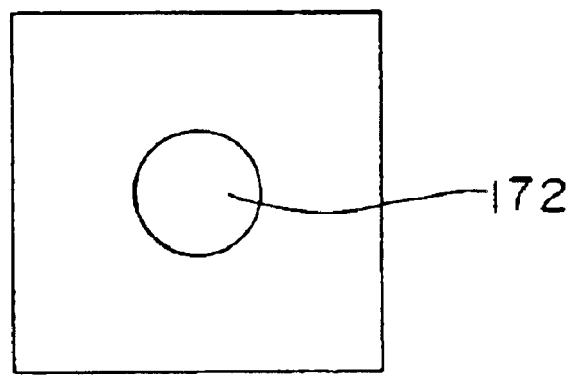
FIG. 13A is a top view of a semiconductor light-emitting device which is a ninth embodiment of the invention.
Figure 13B:
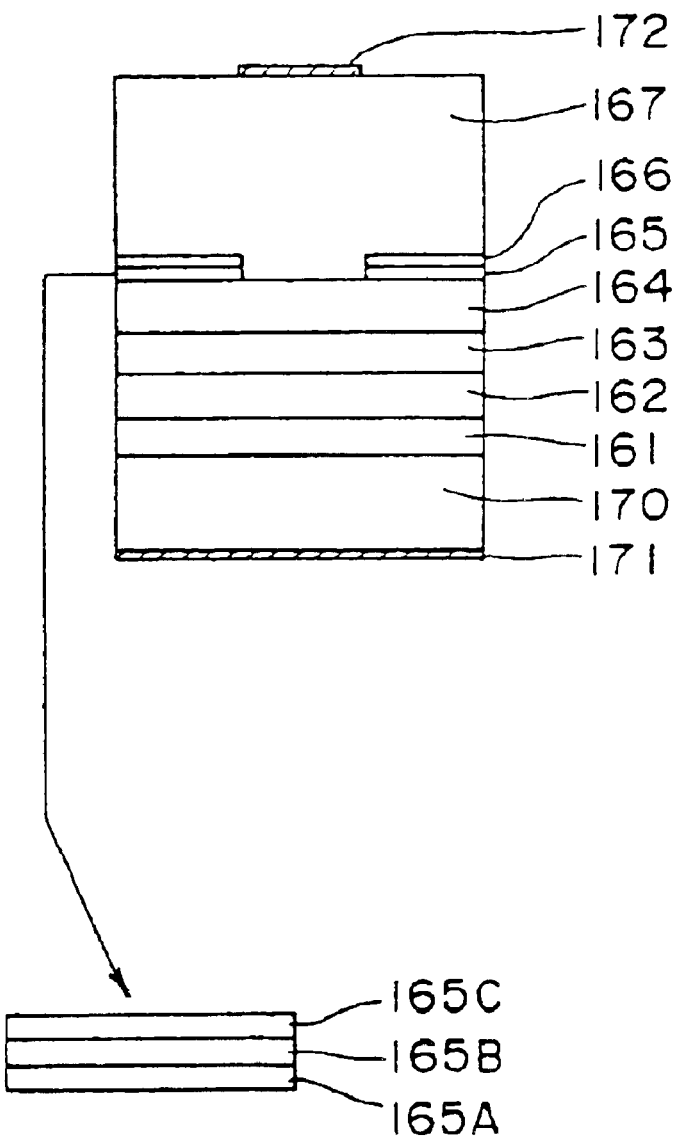
FIG. 13B is a sectional view of the semiconductor light-emitting device.

FIGS. 13A and 13B are a top view and a sectional view, respectively, of a semiconductor light-emitting device which is a ninth embodiment of the invention.

In this semiconductor light-emitting device, as shown in FIGS. 13A and 13B, an n-GaAs buffer layer 161 (thickness: 0.5 μm, Si doping: 5×10$^{17}$ cm$^{-3}$), an n-(Al$_{0.7}$Ga$_{0.3}$)$_{0.5}$In$_{0.5}$P first cladding layer 162 (thickness: 1.0 μm, Si doping: 5×10$^{17}$ cm$^{-3}$), an undoped (Al$_{0.3}$Ga$_{0.7}$)$_{0.5}$In$_{0.5}$P active layer 163 (thickness: 0.6 μm), a p-(Al$_{0.7}$Ga$_{0.3}$)$_{0.5}$In$_{0.5}$P second cladding layer 164 (thickness: 0.7 μm, Zn doping: 5×10$^{17}$ cm$^{-3}$), a p-AlGaInP intermediate band gap layer 165 (thickness: 0.15 μm, Zn doping: 2×10$^{18}$ cm$^{-3}$), a p-GaP protective layer 166 (thickness: 0.1 μm, Zn doping: 1×10$^{18}$ cm$^{-3}$), and a p-GaP current diffusion layer 167 (thickness: 6 μm, Zn doping: 2×10$^{18}$ cm$^{-3}$) are stacked one by one on an n-GaAs substrate 170 by MOCVD process.

In this case, device center regions of the p-GaP protective layer 166 and the p-AlGaInP intermediate band gap layer 165 are removed in a circular shape (the diameter of these circular-shaped removal regions is 100 μm). Then, a first electrode 171 is formed on the substrate side while a second electrode 172 having a diameter of 100 μm is formed on the grown layer side over a region opposite to the removal region.

This semiconductor light-emitting device of the ninth embodiment differs from the semiconductor light-emitting device of the seventh embodiment shown in FIG. 8 in that the intermediate band gap layer 165 is formed of three layers. More specifically, the intermediate band gap layer 165 is formed of a first intermediate band gap layer 165A having a mismatch of −2.6% (thickness: 0.05 μm, Zn doping: 1×10$^{18}$ cm$^{-3}$), a second intermediate band gap layer 165B having a mismatch of −2.8% (thickness: 0.05 μm, Zn doping: 1×10$^{18}$ cm$^{-3}$), and a third intermediate band gap layer 165C having a mismatch of −3.0% (thickness: 0.05 μm, Zn doping: 1×10$^{18}$ cm$^{-3}$), in this order from below.

Figure 14:
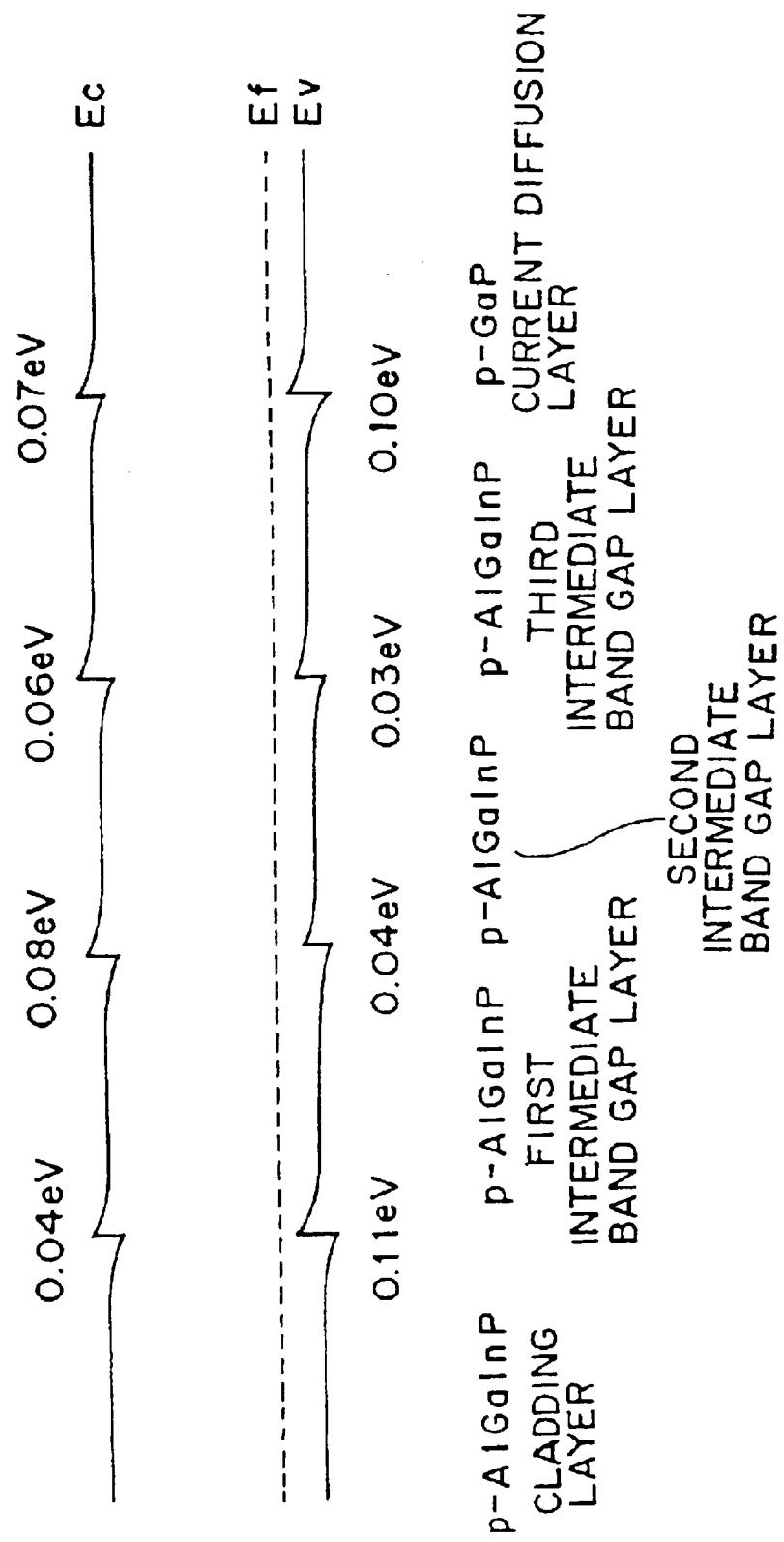
FIG. 14 is a band junction diagram for explaining the effects of the semiconductor light-emitting device.

With this semiconductor light-emitting device of the ninth embodiment, the operating voltage at 20 mA was 1.90 V, smaller as compared with the semiconductor light-emitting device of the seventh embodiment. The reason of this is that, as can be understood from the band junction diagram shown in FIG. 14, the notch height at the junction is further divided and decreased.

Although the ninth embodiment has been described with respect to a semiconductor light-emitting device in which the number of intermediate band gap layers are has been set to 3 layers, yet the number of intermediate band gap layers may be an arbitrary number (2 layers or more).

(Tenth Embodiment)

The semiconductor light-emitting device of a tenth embodiment of the invention differs from the semiconductor light-emitting device of the seventh embodiment in that the second-conductive-type protective layer is a p-Al$_{0.05}$Ga$_{0.9}$In$_{0.05}$P layer.

In this semiconductor light-emitting device of the tenth embodiment, although the ground of the regrown interface in the region through which the current flows is given by a layer containing Al, the 20 mA operating voltage is 2.0 V because the Al content as small as 5% on the basis of a total of the III group. The resulting operating voltage is the same as in the semiconductor light-emitting device of the seventh embodiment.

When this semiconductor light-emitting device of the tenth embodiment was applied to a 5 mm dia. molded article, the emission intensity at a 20 mA conduction was 3.0 cd, the same as in the semiconductor light-emitting device of the first embodiment.

Figure 15:
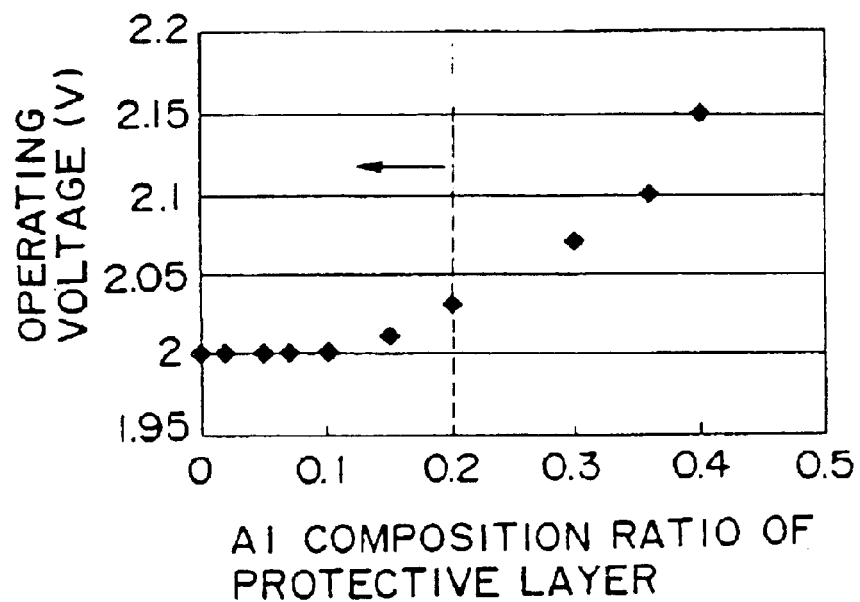
FIG. 15 is a chart showing the relationship between Al composition ratio of a protective layer and operating voltage in a semiconductor light-emitting device which is a tenth embodiment of the invention.

FIG. 15 shows the 20 mA operating voltage of the semiconductor light-emitting device of the seventh embodiment resulting when the Al composition ratio of the secondconductive-type AlGaInP protective layer is varied. As apparent from FIG. 15, the operating voltage of this semiconductor light-emitting device of the tenth embodiment is 0.07 or more lower than that in the case where the protective layer is not provided (first embodiment, in which the 20 mA operating voltage is 2.1 V). Consequently, the Al composition ratio X of the p-AlGaInP protective layer is, desirably, not more than 0.2 (not more than 20%) as a condition for the operating voltage to be not more than 2.03 V.

(Eleventh Embodiment)

The semiconductor light-emitting device which is an eleventh embodiment of the invention differs from the semiconductor light-emitting device of the first embodiment in that the second cladding layer is a p-$Al_{0.5}In_{0.5}P$ layer.

In this semiconductor light-emitting device of the eleventh embodiment, the notch occurring at the valence band between the current diffusion layer and the second cladding layer shown in the band junction diagram of FIG. 2B is even higher (about 0.29 eV) than that of the semiconductor light-emitting device of the first embodiment. As a result, the 20 mA operating voltage at this interface increases to about 3.7 V (against about 3.5 V of the first embodiment).

On the other hand, the notch occurring at the valence band between the intermediate band gap layer and the second cladding layer shown in the band junction of FIG. 2C also becomes higher (about 0.16 eV) than that of the semiconductor light-emitting device of the first embodiment. However, the resultant increase of the 20 mA operating voltage is only about 0.05 V.

Consequently, in this semiconductor light-emitting device, although the 20 mA operating voltage became 2.15 V, being 0.05 V higher than that of the semiconductor light-emitting device of the first embodiment, yet this is no problem practically.

Figure 16:
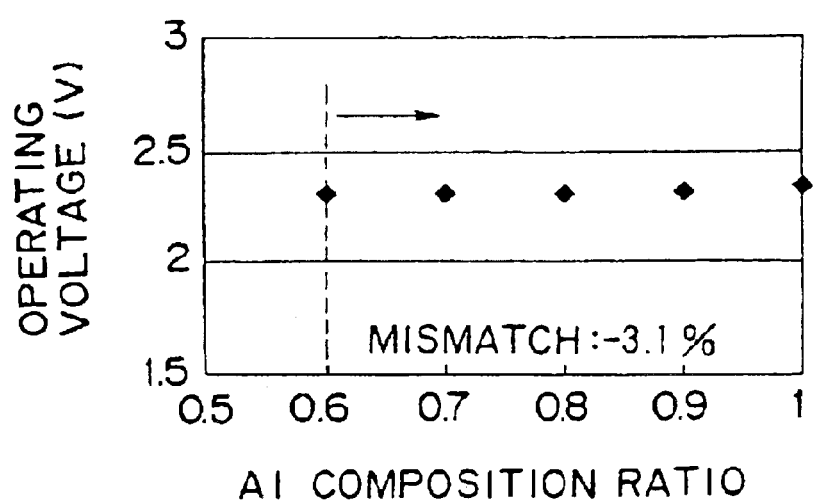
FIG. 16 is a chart showing the relationship between Al composition ratio of a p-cladding layer and operating voltage in a semiconductor light-emitting device which is an eleventh embodiment of the invention.

FIG. 16 shows the 20 mA operating voltage resulting when the Al composition ratio X of the p-$(Al_xGa_{1-x})_{0.5}In_{0.5}P$ second cladding layer was varied. In this case, the intermediate band gap layer was given by a layer having a mismatch of −3.1% to GaAs. With the Al composition being not less than 0.6, the operating voltage was not more than 2.5 V, which is a permissible level. On the other hand, with the Al composition ratio X being less than 0.6, the emission intensity decreases (which would be attributed to the fact that a hetero-barrier between p-cladding layer and active layer cannot be obtained). Thus, the Al composition is desirably within a range of $0.6 \leq X \leq 1.0$.

Figure 17:
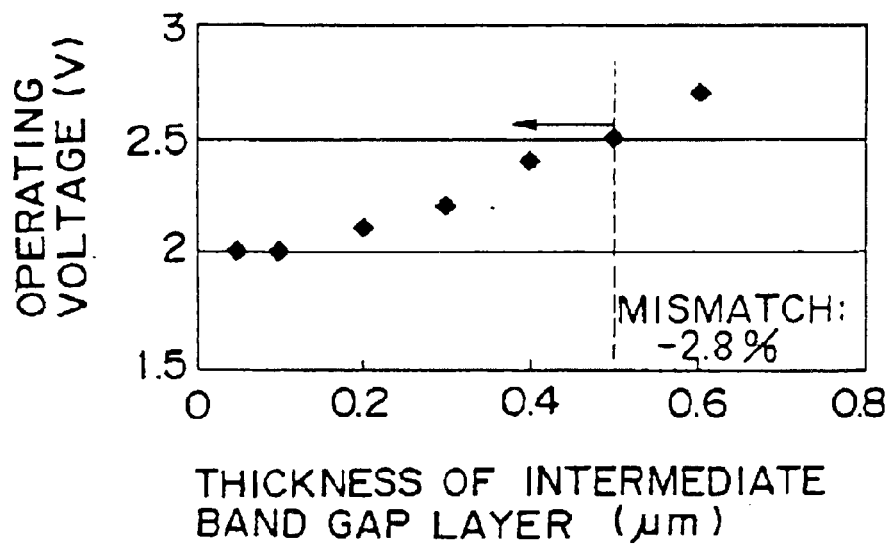
FIG. 17 is a chart showing the relationship between layer thickness of the intermediate band gap layer and operating voltage in the semiconductor light-emitting device.

Also, FIG. 17 shows the 20 mA operating voltage resulting when the layer thickness of the intermediate layer was varied in the semiconductor light-emitting device of the seventh embodiment shown in FIG. 8. As can be understood from FIG. 17, since the operating voltage increases beyond 2.5 V with the intermediate layer thickness beyond 0.5 μm, the thickness of the intermediate layer is desirably not more than 0.5 μm. The reason that the operating voltage increases with increasing thickness of the intermediate layer can be considered that a resistance component of the intermediate layer itself emerges.

Figure 18:
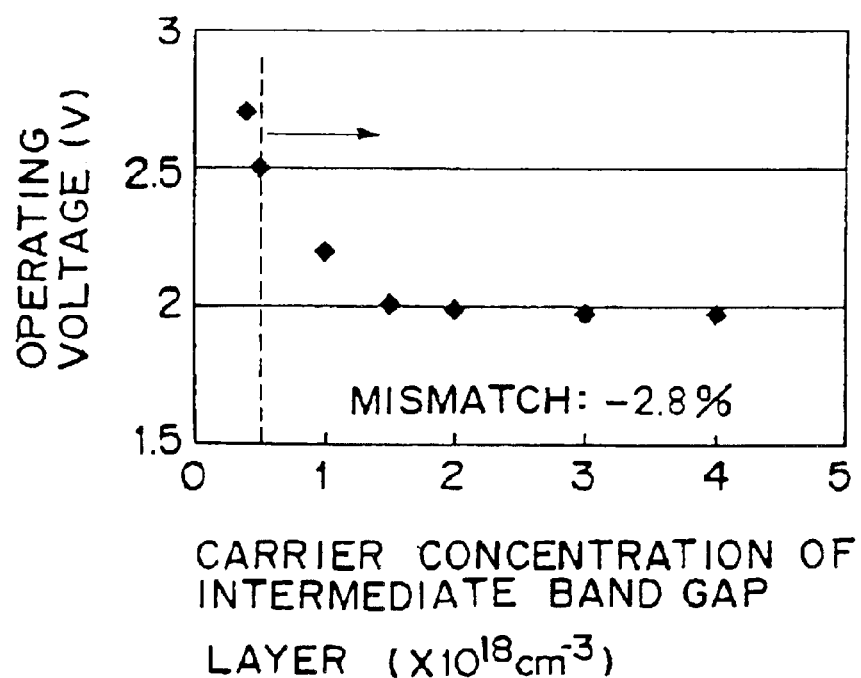
FIG. 18 is a chart showing the relationship between carrier concentration of the intermediate band gap layer and operating voltage in the semiconductor light-emitting device.

Also, FIG. 18 shows the 20 mA operating voltage resulting when the carrier concentration of the intermediate layer was varied in the semiconductor light-emitting device of the seventh embodiment shown in FIG. 8. As can be understood from FIG. 18, since the operating voltage increases beyond 2.5 V with the carrier concentration of the intermediate layer being under $0.5 \times 10^{18}$ cm$^{-3}$, the carrier concentration of the intermediate layer is desirably not less than $0.5 \times 10^{18}$ cm$^{-3}$. The reason that the operating voltage increases with decreasing carrier concentration of the intermediate layer can be considered that series resistance of the notch part increases.

(Twelfth Embodiment)

FIGS. 19A, 19B, 19C and 19D show a semiconductor light-emitting device manufacturing method according to the present invention.

First, an n-GaAs buffer layer 181 with a thickness of 0.5 μm (Si doping: $5 \times 10^{17}$ cm$^{-3}$), an n-$(Al_{0.07}Ga_{0.3})_{0.5}In_{0.5}P$ first cladding layer 182 with a thickness of 1.0 μm (Si doping: $5 \times 10^{17}$ cm$^{-3}$), an undoped $(Al_{0.3}Ga_{0.7})_{0.5}In_{0.5}P$ active layer 183 with a thickness of 0.6 μm, a p-$(Al_{0.7}Ga_{0.3})_{0.5}In_{0.5}P$ second cladding layer 184 with a thickness of 0.7 μm (Zn doping: $5 \times 10^{17}$ cm$^{-3}$), a p-$(Al_{0.4}Ga_{0.6})_{0.9}In_{0.1}P$ intermediate band gap layer 185 with a thickness of 0.15 μm, and a p-GaP protective layer 186 with a thickness of 0.1 μm (Zn doping: $1 \times 10^{18}$ cm$^{-3}$) are stacked one by one on an n-GaAs substrate 190 by MOCVD process (FIG. 19A).

Subsequently, a pattern is formed with an ordinary photomask, and then device center regions of the protective layer 186 and the intermediate band gap layer 185 are removed by etching, by which a protective layer 186A and an intermediate band gap layer 185A each having a circular-shaped removal region are formed (FIG. 19B).

For example, the 0.1 μm thick p-GaP protective layer 186 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 185 can also be etched by being dipped for about 2 min. in the same solution.

Thereafter, a p-GaP current diffusion layer 187 (Zn doping: $2 \times 10^{18}$ cm$^{-3}$) is grown to a thickness of 6 μm also by MOCVD process (FIG. 19C).

Next, a first electrode 191 is formed overall under the n-GaAs substrate 190, while a circular-shaped second electrode 192 is formed over the grown-layer side device center region opposite to the removal region (FIG. 19D). This grown-layer side second electrode 192 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$(Al_{0.7}Ga_{0.3})_{0.5}In_{0.5}P$ second cladding layer 184 and the p-GaP current diffusion layer 187 is formed, so that a high-resistance interface can be formed.

In this case, the n-type first cladding layer 182, the active layer 183 and the p-type second cladding layer 184 need only to be AlGaInP layers that provide lattice matching with GaAs. Also, the p-GaP current diffusion layer 187 needs only to be a semiconductor that forms a heterojunction of type II with the p-type second cladding layer 184.

(Thirteenth Embodiment)

FIGS. 20A, 20B, 20C and 20D show a semiconductor light-emitting device manufacturing method which is a thirteenth embodiment of the invention.

First, an n-GaAs buffer layer 201 with a thickness of 0.5 μm (Si doping: $5 \times 10^{17}$ cm$^{-3}$), an n-$(Al_{0.7}Ga_{0.3})_{0.5}In_{0.5}P$ first cladding layer 202 with a thickness of 1.0 μm (Si doping: $5 \times 10^{17}$ cm$^{-3}$), an undoped $(Al_{0.3}Ga_{0.7})_{0.5}In_{0.5}P$ active layer 203 with a thickness of 0.6 μm, a p-$(Al_{0.7}Ga_{0.3})_{0.5}In_{0.5}P$ second cladding layer 204 with a thickness of 0.7 μm (Zn doping: $5 \times 10^{17}$ cm$^{-3}$), a p-$(Al_{0.4}Ga_{0.6})_{0.9}In_{0.1}P$ intermediate band gap layer 205 with a thickness of 0.15 μm, and a p-GaP protective layer 206 with a thickness of 0.1 μm (Zn doping: $1 \times 10^{18}$ cm$^{-3}$) are stacked one by one on an n-GaAs substrate 210 by MOCVD process (FIG. 20A).

Subsequently, a pattern is formed with an ordinary photomask, and then device center regions of the protective layer 206 and the intermediate band gap layer 205 are removed by etching, and further a 0.4 μm thick upper portion of the p-AlGaInP second cladding layer 204 corresponding to the above removal regions is removed by etching. Thus, a protective layer 206A, an intermediate band gap layer 205A and a second cladding layer 204A each having a circular-shaped removal region are formed (FIG. 20B).

For example, the 0.1 μm thick p-GaP protective layer 206 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 205 can also be etched by being dipped for about 2 min. in the same solution. Next, the p-AlGaInP second cladding layer 204 can be etched to nearly a desired position (remaining thickness: 0.3 μm) by being dipped for about 4 min. in a $H_3PO_4$ undiluted solution (40° C.).

Thereafter, a p-GaP current diffusion layer 207 (Zn doping: $2 \times 10^{18}$ cm$^{-3}$) is grown to a thickness of 6 μm also by MOCVD process (FIG. 20C).

Next, a first electrode 211 is formed overall under the n-GaAs substrate 210, while a circular-shaped second electrode 212 is formed over the grown-layer side device center region (FIG. 20D). The grown-layer side second electrode 212 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$(Al_{0.7}Ga_{0.3})_{0.5}In_{0.5}P$ second cladding layer 204 and the p-GaP current diffusion layer 207 is formed, so that a high-resistance interface can be formed.

In this case, the n-type first cladding layer 202, the active layer 203 and the p-type second cladding layer 204 need only to be AlGaInP layers that provide lattice matching with GaAs.

Also, the current diffusion layer 207 needs only to be a semiconductor that forms a heterojunction of type II with the p-type second cladding layer 204.

(Fourteenth Embodiment)

FIGS. 21A, 21B, 21C and 21D show a semiconductor light-emitting device manufacturing method which is a thirteenth embodiment of the invention.

First, an n-GaAs buffer layer 221 with a thickness of 0.5 μm (Si doping: $5 \times 10^{17}$ cm$^{-3}$), an n-$(Al_{0.7}Ga_{0.3})_{0.5}In_{0.5}P$ first cladding layer 222 with a thickness of 1.0 μm (Si doping: $5 \times 10^{17}$ cm$^{-3}$) an undoped $(Al_{0.3}Ga_{0.7})_{0.5}In_{0.5}P$ active layer 223 with a thickness of 0.6 μm, and a p-$(Al_{0.7}Ga_{0.3})_{0.5}In_{0.5}P$ second cladding layer 224 with a thickness of 0.3 μm (Zn doping: $5 \times 10^{17}$ cm$^{-3}$) are stacked on an n-GaAs substrate 230 by MOCVD process. Then, a p-$Ga_{0.5}In_{0.5}P$ etching stop layer 225 with a thickness of 0.01 μm (Zn doping: $5 \times 10^{17}$ cm$^{-3}$), a p-$(Al_{0.7}Ga_{0.3})_{0.5}In_{0.5}P$ third cladding layer 226 with a thickness of 0.4 μm (Zn doping: $5 \times 10^{17}$ cm$^{-3}$) a p-$(Al_{0.4}Ga_{0.6})_{0.9}In_{0.1}P$ intermediate band gap layer 227 with a thickness of 0.15 μm, and a p-GaP protective layer 228 with a thickness of 0.1 μm (Zn doping: $1 \times 10^{18}$ cm$^{-3}$) are stacked one by one (FIG. 21A).

Subsequently, a pattern is formed with an ordinary photomask, and then device center regions of the protective layer 228, the intermediate band gap layer 227 and the p-AlGaInP third cladding layer 226 are removed by etching, by which a protective layer 228A, an intermediate band gap layer 227A and a third cladding layer 226A each having a circular-shaped removal region are formed (FIG. 21B).

For example, the 0.1 μm thick p-GaP protective layer 228 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 227 can also be etched by being dipped for about 2 min. in the same solution.

Next, the 0.4 μm thick p-AlGaInP third cladding layer 226 can be completely etched by being dipped for about 5 min. in a $H_3PO_4$ undiluted solution (40° C.). As to the reason of this, although the 0.4 μm thick p-AlGaInP third cladding layer 226 can be generally etched in four min. as described in the semiconductor light-emitting device manufacturing method of the thirteenth embodiment, yet the p-GaInP layer contributes as the etching stop layer 225 and therefore the p-AlGaInP third cladding layer 226 is dipped somewhat longer so that etching irregularities can be eliminated.

Thereafter, a p-GaP current diffusion layer 229 (Zn doping: $2 \times 10^{18}$ cm$^{-3}$) is grown to a thickness of 6 μm also by MOCVD process (FIG. 21C).

Next, a first electrode 231 is formed overall under the n-GaAs substrate 230, while a circular-shaped second electrode 232 is formed over the grown-layer side device center region (FIG. 21D). The grown-layer side second electrode 232 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$Ga_{0.5}In_{0.5}P$ etching stop layer 225 and the p-GaP current diffusion layer 229 is formed, so that a high-resistance interface can be formed.

In this case, the n-type first cladding layer 222, the active layer 223, the p-type second cladding layer 224 and the third cladding layer 226 need only to be AlGaInP layers that provide lattice matching with GaAs. Also, the current diffusion layer 229 needs only to be a semiconductor that forms a heterojunction of type II with the second cladding layer 224.

(Fifteenth Embodiment)

FIGS. 22A, 22B, 22C and 22D show a semiconductor light-emitting device manufacturing method which is a fifteenth embodiment of the invention.

First, by MOCVD process, on an n-GaAs substrate 250 is grown an n-GaAs buffer layer 241 (Si doping: $5 \times 10^{17}$ cm$^{-3}$) to a thickness of 0.5 μm, and then, ten pairs of n-$Al_{0.5}In_{0.5}P$ layer and n-$(Al_{0.4}Ga_{0.6})_{0.5}In_{0.5}P$ layer are further formed, by which a DBR (optical reflection) layer 242 is formed (thickness of each layer: 0.05 μm, Si doping of each layer: $5 \times 10^{17}$ cm$^{-3}$). Subsequently, an n-$(Al_{0.7}Ga_{0.3})_{0.5}In_{0.5}P$ first cladding layer 243 with a thickness of 1.0 μm (Si doping: $5 \times 10^{17}$ cm$^{-3}$), an undoped $(Al_{0.3}Ga_{0.7})_{0.5}In_{0.5}P$ active layer 244 with a thickness of 0.6 μm, a p-$(Al_{0.7}Ga_{0.3})_{0.5}In_{0.5}P$ second cladding layer 245 with a thickness of 0.7 μm (Zn doping: $5 \times 10^{17}$ cm$^{-3}$), a p-$(Al_{0.4}Ga_{0.6})_{0.9}In_{0.1}P$ intermediate band gap layer 246 with a thickness of 0.15 μm, and a p-GaP protective layer 247 with a thickness of 0.1 μm (Zn doping: $1 \times 10^{18}$ cm$^{-3}$) are stacked one by one (FIG. 22A).

Subsequently, a pattern is formed with an ordinary photomask, and then regions of the protective layer 247 and the intermediate band gap layer 246 other than their device center regions are removed by etching, by which circular-shaped protective layer 247A and intermediate band gap layer 246A are formed (FIG. 22B).

For example, the 0.1 μm thick p-GaP protective layer 247 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 246 can also be etched by being dipped for about 2 min. in the same solution.

Thereafter, a p-$(Al_{0.05}Ga_{0.95})_{0.9}In_{0.1}P$ current diffusion layer 248 (Zn doping: $2 \times 10^{18}$ cm$^{-3}$) is grown to a thickness of 6 μm also by MOCVD process (FIG. 22C).

Next, a first electrode 251 is formed overall under the n-GaAs substrate 250, while a second electrode 252 is formed over the region other than the device center region on the grown layer side (FIG. 22D). The grown-layer side second electrode 252 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$(Al_{0.7}Ga_{0.3})_{0.5}In_{0.5}P$ second cladding layer 245 and the p-$(Al_{0.05}Ga_{0.95})_{0.9}In_{0.1}P$ current diffusion layer 248 is formed, so that a high-resistance interface can be formed.

In this case, the n-type first cladding layer 243, the active layer 244 and the p-type second cladding layer 245 need only to be AlGaInP layers that provide lattice matching with GaAs. Also, the current diffusion layer 248 needs only to be a semiconductor that forms a heterojunction of type II with the p-type second cladding layer 245.

(Sixteenth Embodiment)

FIGS. 23A, 23B, 23C and 23D show a semiconductor light-emitting device manufacturing method which is a sixteenth embodiment of the invention.

First, by MOCVD process, on an n-GaAs substrate 270 is grown an n-GaAs buffer layer 261 (Si doping: $5\times10^{17}$ cm$^{-3}$) to a thickness of 0.5 $\mu$m, and then, ten pairs of n-$Al_{0.5}In_{0.5}P$ layer and n-$(Al_{0.4}Ga_{0.6})_{0.5}In_{0.5}P$ layer are further formed, by which a DBR layer 262 is formed (thickness of each layer: 0.05 $\mu$m, Si doping of each layer: $5\times10^{17}$ cm$^{-3}$). Subsequently, an n-$(Al_{0.7}Ga_{0.3})_{0.5}In_{0.5}P$ first cladding layer 263 with a thickness of 1.0 $\mu$m (Si doping: $5\times10^{17}$ cm$^{-3}$), an undoped $(Al_{0.3}Ga_{0.7})_{0.5}In_{0.5}P$ active layer 264 with a thickness of 0.6 $\mu$m, a p-$(Al_{0.7}Ga_{0.3})_{0.5}In_{0.5}P$ second cladding layer 265 with a thickness of 0.7 $\mu$m (Zn doping: $5\times10^{17}$ cm$^{-3}$), a p-$(Al_{0.4}Ga_{0.6})_{0.9}In_{0.1}P$ intermediate band gap layer 266 with a thickness of 0.15 $\mu$m, and a p-GaP protective layer 267 with a thickness of 0.1 $\mu$m (Zn doping: $1\times10^{18}$ cm$^{-3}$) are stacked one by one (FIG. 23A).

Subsequently, a pattern is formed with an ordinary photomask, and then regions of the protective layer 267 and the intermediate band gap layer 266 other than their device center regions are removed by etching, and a 0.3 $\mu$m thick upper portion of the p-AlGaInP second cladding layer 265 corresponding to the above removal regions is removed by etching (FIG. 23B).

For example, the 0.1 $\mu$m thick p-GaP protective layer 267 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 266 can also be etched by being dipped for about 2 min. in the same solution. Next, the p-AlGaInP second cladding layer 265 can be etched generally to a desired position (remaining thickness: 0.3 $\mu$m) by being dipped for about 4 min. in a $H_3PO_4$ undiluted solution (40° C.).

Thereafter, a p-$(Al_{0.05}Ga_{0.95})_{0.9}In_{0.1}P$ current diffusion layer 268 (Zn doping: $2\times10^{18}$ cm$^{-3}$) is grown to a thickness of 6 $\mu$m also by MOCVD process (FIG. 23C).

Next, a first electrode 271 is formed overall under the n-GaAs substrate 270, while a second electrode 272 is formed over the region other than the device center region on the grown layer side (FIG. 23D). The grown-layer side second electrode 272 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$(Al_{0.7}Ga_{0.3})_{0.5}In_{0.5}P$ second cladding layer 265 and the p-$(Al_{0.5}Ga_{0.95})_{0.9}In_{0.1}P$ current diffusion layer 269 is formed, so that a high-resistance interface can be formed.

In this case, the n-type first cladding layer 263, the active layer 264 and the p-type second cladding layer 265 need only to be AlGaInP layers that provide lattice matching with GaAs. Also, the current diffusion layer 268 (269) needs only to be a semiconductor that forms a heterojunction of type II with the p-type second cladding layer 265.

(Seventeenth Embodiment)

FIGS. 24A, 24B, 24C and 24D show a semiconductor light-emitting device manufacturing method which is a seventeenth embodiment of the invention.

First, by MOCVD process, on an n-GaAs substrate 290 is grown an n-GaAs buffer layer 281 (Si doping: $5\times10^{17}$ cm$^{-3}$) to a thickness of 0.5 $\mu$m, and then, ten pairs of n-$Al_{0.5}In_{0.5}P$ layer and n-$(Al_{0.4}Ga_{0.6})_{0.5}In_{0.5}P$ layer are further formed, by which a DBR layer 282 is formed (thickness of each layer: 0.05 $\mu$m, Si doping of each layer: $5\times10^{17}$ cm$^{-3}$). Subsequently, an n-$(Al_{0.7}Ga_{0.3})_{0.5}In_{0.5}P$ first cladding layer 283 with a thickness of 1.0 $\mu$m (Si doping: $5\times10^{17}$ cm$^{-3}$), an undoped $(Al_{0.3}Ga_{0.7})_{0.5}In_{0.5}P$ active layer 284 with a thickness of 0.6 $\mu$m, and a p-$(Al_{0.7}Ga_{0.3})_{0.5}In_{0.5}P$ second cladding layer 285 with a thickness of 0.3 $\mu$m (Zn doping: $5\times10^{17}$ cm$^{-3}$) are stacked one by one. After this, a p-$Ga_{0.5}In_{0.5}P$ etching stop layer 286 with a thickness of 0.01 $\mu$m (Zn doping: $5\times10^{17}$ cm$^{-3}$), a p-$(Al_{0.7}Ga_{0.3})_{0.5}In_{0.5}P$ third cladding layer 287 with a thickness of 0.4 $\mu$m (Zn doping: $5\times10^{17}$ cm$^{-3}$) a p-$(Al_{0.4}Ga_{0.6})_{0.9}In_{0.1}P$ intermediate band gap layer 288 with a thickness of 0.15 $\mu$m, and a p-GaP protective layer 289 with a thickness of 0.1 $\mu$m (Zn doping: $1\times10^{18}$ cm$^{-3}$) are stacked one by one (FIG. 24A).

Subsequently, a pattern is formed with an ordinary photomask, and then regions of the protective layer 289, the intermediate band gap layer 288 and the p-AlGaInP third cladding layer 287 other than their device center regions are removed by etching, by which circular-shaped protective layer 289A, intermediate band gap layer 288A and third cladding layer 287A are formed (FIG. 24B).

For example, the 0.1 $\mu$m thick p-GaP protective layer 289 can be etched by being dipped for about 1 min. in a solution (50° C.) of $H_2SO_4:H_2O_2:H_2O=3:1:1$, and the p-$(Al_{0.4}Ga_{0.6})_{0.9}In_{0.1}P$ intermediate band gap layer 288 can also be etched by being dipped for about 2 min. in the same solution. Next, the 0.4 $\mu$m p-AlGaInP third cladding layer 287 can be completely etched by being dipped for about 5 min. in a $H_3PO_4$ undiluted solution (40° C.). As to the reason of this, although the 0.4 $\mu$m thick p-AlGaInP third cladding layer 287 can be generally etched in four min. as described in the semiconductor light-emitting device manufacturing method of the sixteenth embodiment, yet the p-GaInP layer contributes as the etching stop layer 286 and therefore the p-AlGaInP third cladding layer 287 is dipped somewhat longer so that etching irregularities can be eliminated.

Thereafter, a p-$(Al_{0.05}Ga_{0.95})_{0.9}In_{0.1}P$ current diffusion layer 293 (Zn doping: $2\times10^{18}$ cm$^{-3}$) is grown to a thickness of 6 $\mu$m also by MOCVD process (FIG. 24C).

Next, a first electrode 291 is formed overall under the n-GaAs substrate 290, while a second electrode 272 is formed over the region other than the device center region on the grown layer side (FIG. 24D). The grown-layer side second electrode 292 may be formed either by forming an electrode overall on the grown layer side and then using an ordinary photomask, or by selectively depositing the electrode with a metal mask.

With the use of this semiconductor light-emitting device manufacturing method, a heterojunction of type II by the p-$Ga_{0.5}In_{0.5}P$ etching stop layer 286 and the p-$(Al_{0.05}Ga_{0.95})_{0.9}In_{0.1}P$ current diffusion layer 293 is formed, so that a high-resistance interface can be formed.

In this case, the n-type first cladding layer 283, the active layer 284 and the p-type second cladding layer 285 need only to be AlGaInP layers that provide lattice matching with GaAs. Also, the current diffusion layer 293 needs only to be a semiconductor that forms a heterojunction of type II with the second cladding layer 285.

Although it has been assumed in the foregoing first to seventeenth embodiments that the first conductive type is n type and the second conductive type is p type, yet it is of course possible that the first conductive type is p type and the second conductive type is n type.

Also, the first electrodes 11, 31, 51, 71, 91, 111, 131, 151, 171, 191, 211, 231, 251, 271 and 291 have been formed overall on the substrates 10, 30, 50, 70, 90, 110, 130, 150, 170, 190, 210, 230, 250, 270 and 290 in the foregoing first to seventeenth embodiments. However, those electrodes may be formed partly on the substrates.

Furthermore, although the second electrodes 12, 32, 52, 132, 152 and 172 as well as the removal regions of the second electrodes 72, 92 and 112 have been circular-shaped in the first to eleventh embodiments, yet the shape of the second electrodes is not limited to this and may be formed into other shapes such as quadrangular shapes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer; removing a device center region of the second-conductive-type protective layer and a device center region of the second-conductive-type intermediate band gap layer, respectively, by etching;

after the removal step of the second-conductive-type protective layer and intermediate band gap layer, stacking a current diffusion layer on the second-conductive-type protective layer arid the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the device center region on the second-conductive-type current diffusion layer.

2. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing a device center region of the second-conductive-type protective layer and a device center region of the second-conductive-type intermediate band gap layer, respectively, by etching, and further removing an upper-side portion of a region of the second-conductive-type second cladding layer corresponding to the removal region by etching;

after the removal step of the second-conductive-type protective layer, intermediate band gap layer and second cladding layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the ether side of the surface of the first-conductive-type semiconductor substrate; and forming a second electrode over the device center region on the second-conductive-type current diffusion layer.

3. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type etching stop layer, a second-conductive type third cladding layer, a second-conductive-type intermediate band gap layer and a second-conductive-type protective layer;

removing device center regions of the second-conductive-type protective layer, the second-conductive-type intermediate band gap layer and the second-conductive-type third cladding layer by etching;

after the removal step of the second-conductive-type protective layer, intermediate band gap layer and third cladding layer, stacking a second-conductive-type current diffusion layer on the second-conductive-type protective layer and the second-conductive-type etching stop layer to form, in the second-conductive-type current diffusion layer, the second-conductive-type etching stop layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the device center region on the second-conductive-type current diffusion layer.

4. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing regions of the second-conductive-type protective layer and the second-conductive-type intermediate band gap layer other than their device center regions, respectively, by etching;

after the removal step of the second-conductive-type protective layer and intermediate band gap layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

5. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type intermediate band gap layer and a second-conductive-type protective layer;

removing regions of the second-conductive-type protective layer and the second-conductive-type intermediate band gap layer other than their device center regions, respectively, by etching, and further removing an upper-side portion of a region of the second-conductive-type second cladding layer corresponding to the removal region by etching;

after the removal step of the second-conductive-type protective layer, intermediate band gap layer and second cladding layer, stacking a second-conductive-type current diffusion layer on the second-conductive-type protective layer and the second-conductive-type second cladding layer to form, in the second-conductive-type current diffusion layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

6. A method for manufacturing a semiconductor light-emitting device, comprising the steps of:

stacking, one by one on one side of a surface of a first-conductive-type semiconductor substrate, a first-conductive-type first cladding layer, a first-conductive-type or second-conductive-type or an undoped active layer, a second-conductive-type second cladding layer, a second-conductive-type etching stop layer, a second-conductive-type third cladding layer, a second-conductive-type intermediate band gap layer and a second-conductive-type protective layer;

removing regions of the second-conductive-type protective layer, the second-conductive-type intermediate band gap layer and the second-conductive-type third cladding layer other than their device center regions, respectively, by etching;

after the removal step of the second-conductive-type protective layer, intermediate band gap layer and third cladding layer, stacking a second-conductive-type current diffusion layer on the second-conductive-type protective layer and the second-conductive-type etching stop layer to form, in the second-conductive-type current diffusion layer, the second-conductive-type etching stop layer and the second-conductive-type second cladding layer, an energy band structure in which an upper-end position of valence band and a lower-end position of conduction band are in a type II relation;

forming a first electrode overall on the other side of the surface of the first-conductive-type semiconductor substrate; and forming a second electrode over the region other than the device center region on the second-conductive-type current diffusion layer.

* * * * *